United States Patent [19]

Kimura et al.

[11] Patent Number: 5,444,413
[45] Date of Patent: Aug. 22, 1995

[54] OPERATIONAL AMPLIFIER CIRCUIT WITH VARIABLE BIAS DRIVEN FEEDBACK VOLTAGE CONTROLLER

[75] Inventors: Tomohisa Kimura, Funahashi; Tetsuro Itakura, Fujisawa, both of Japan

[73] Assignee: Kabushiki Kaisha Toshiba, Kawasaki, Japan

[21] Appl. No.: 943,493

[22] Filed: Sep. 11, 1992

[30] Foreign Application Priority Data

Sep. 12, 1991 [JP] Japan ................... 3-232692

[51] Int. Cl.$^6$ ..................... H03K 5/24; H03K 17/04
[52] U.S. Cl. ........................ 327/562; 327/563
[58] Field of Search ............... 307/494, 496, 496, 497, 307/501; 330/253, 257, 288; 327/561, 562, 563

[56] References Cited

U.S. PATENT DOCUMENTS 4,987,379  1/1991  Hughes .................. 330/257 X
5,162,749  11/1992 Kobayashi ............... 330/253
5,311,071  5/1994  Ueda .................... 307/494 X

FOREIGN PATENT DOCUMENTS 0004768  1/1992  Japan .

OTHER PUBLICATIONS

IEEE Journal of Solid-State Circuits, vol. SC-18, No. 6, Dec. 1983, pp. 629-633, B. Ahuja, "An Improved Frequency Compensation Technique for CMOS Operational Amplifiers".
IEEE Journal of Solid-State Circuits, vol. SC-19, No. 6, Dec. 1984, pp. 919-925, D. Ribner, et al., "Design Technique for Cascoded CMOS OP Amps with Improved PSRR and Common-Mode Input Range".

*Primary Examiner*—Willis R. Wolfe
*Attorney, Agent, or Firm*—Oblon, Spivak, McClelland, Maier & Neustadt

[57] ABSTRACT

An operational amplifier circuit includes a differential amplifier having an inverting input, a non-inverting input, and first and second outputs. The differential amplifier is fed by a current source coupled to a power supply voltage. An active load circuit is coupled to the first and second outputs of the differential amplifier and to a ground potential. An additional transistor is provided having a first current-carrying electrode coupled to the first output of the differential amplifier, a second current-carrying electrode coupled to the active load circuit, and an insulated gate electrode coupled to the active load circuit and the second output of the differential amplifier. An inversion amplifier has an input coupled to the second current-carrying electrode of the transistor, and an output, which is fed back through a compensation capacitor to the first output of the differential amplifier.

29 Claims, 15 Drawing Sheets

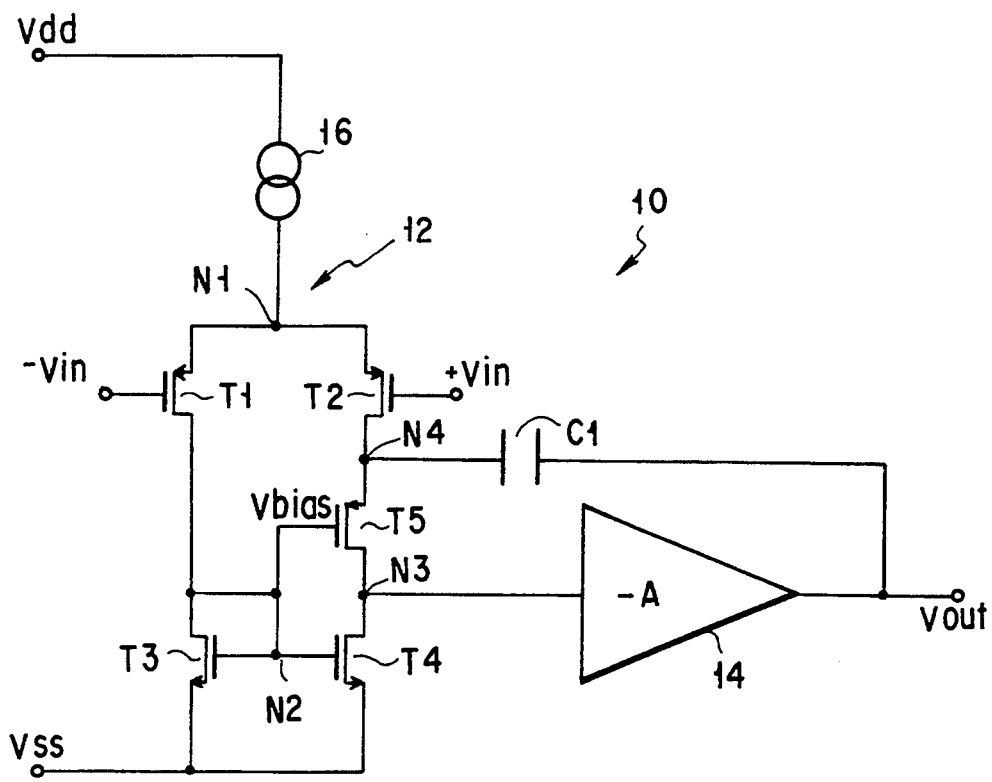
F I G. 1
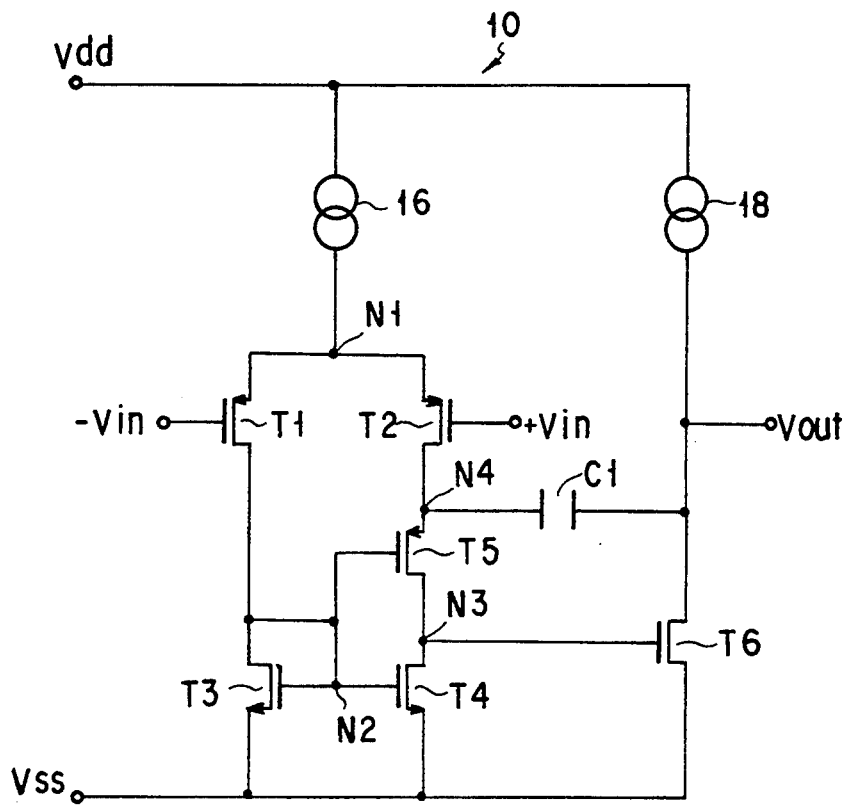
F I G. 2

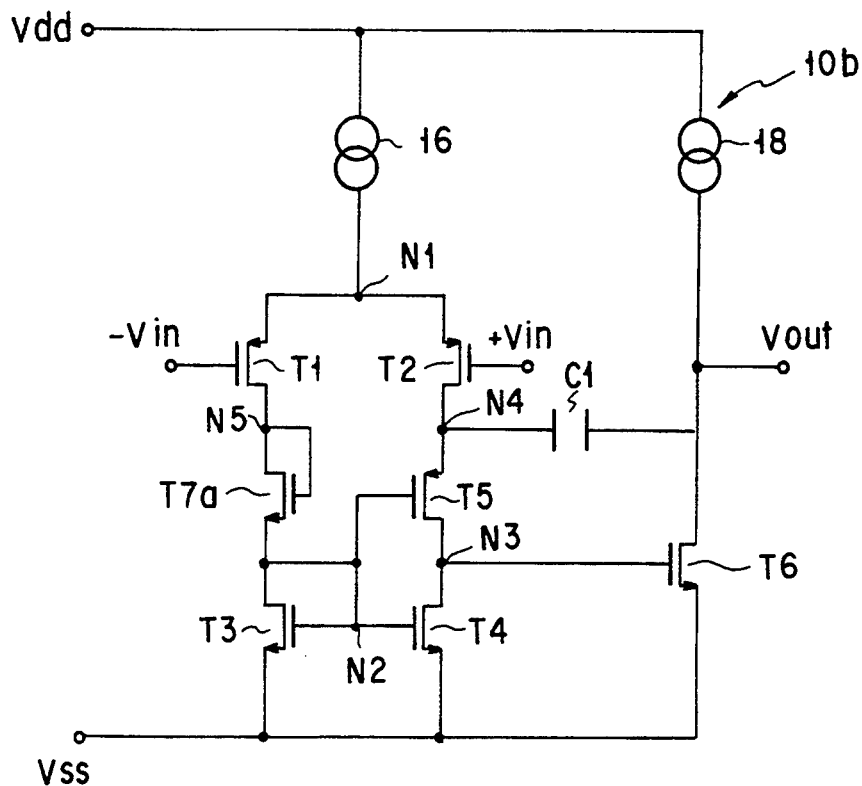
F I G. 5
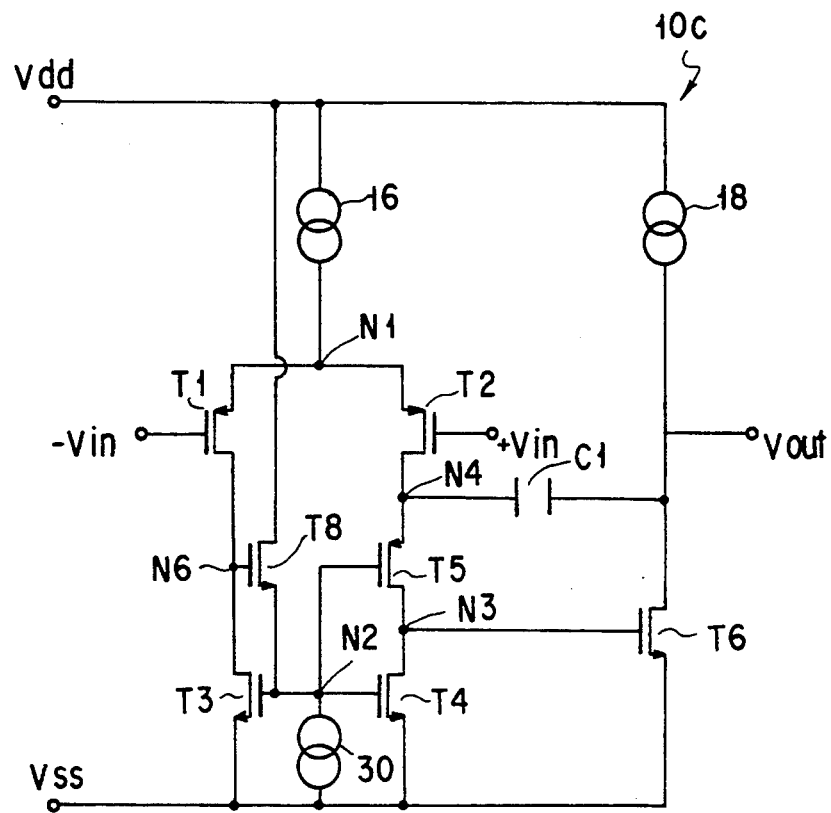
F I G. 6

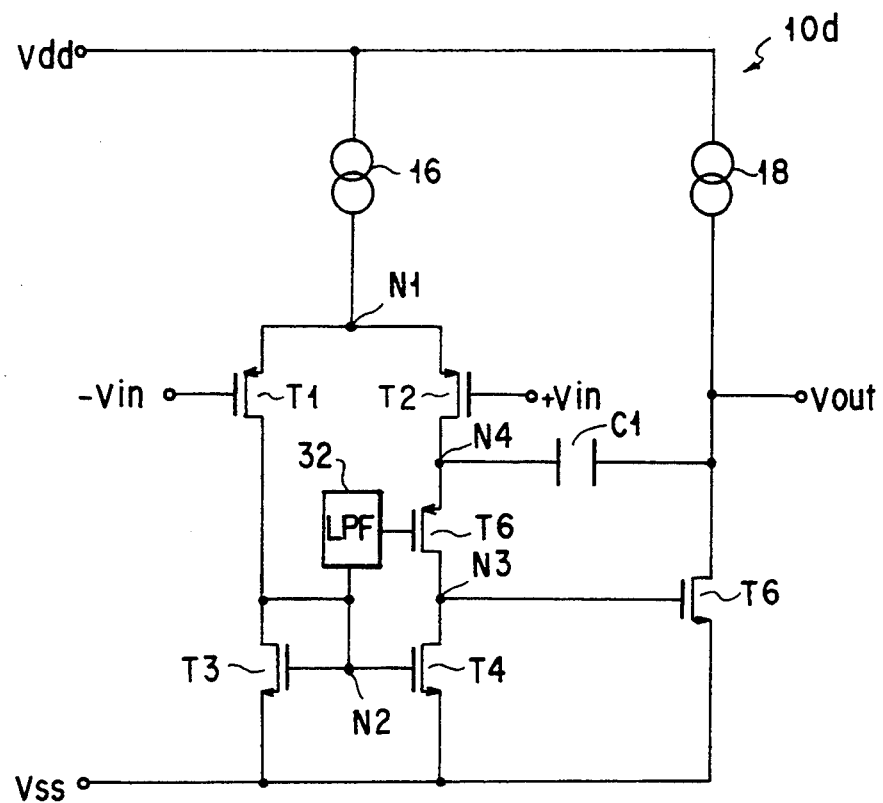
F I G. 7
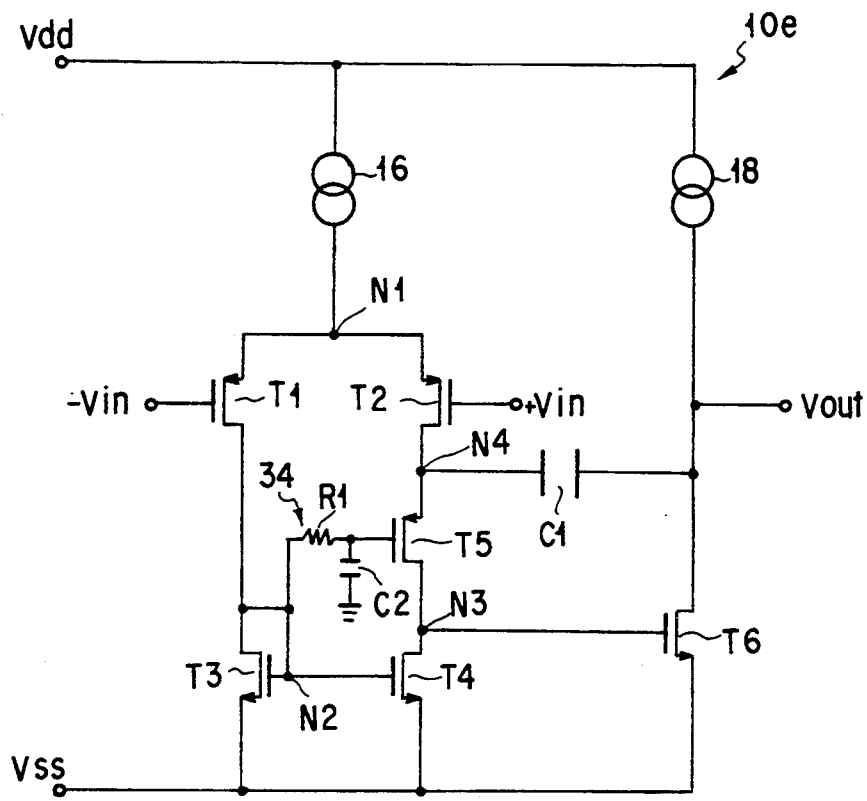
F I G. 8

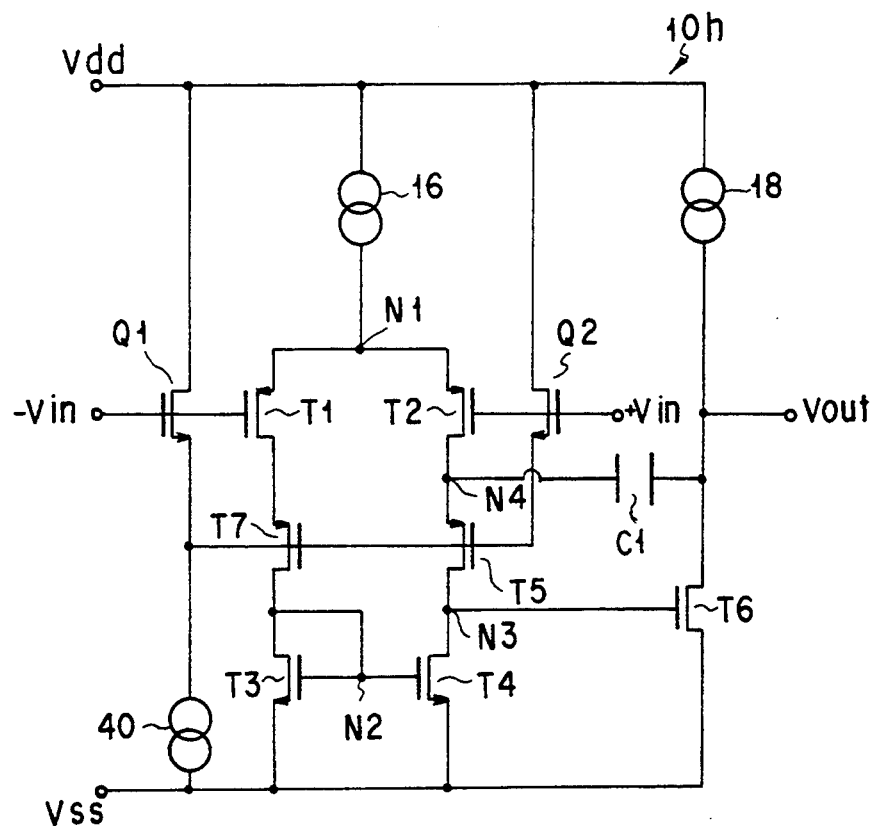
F I G. 11
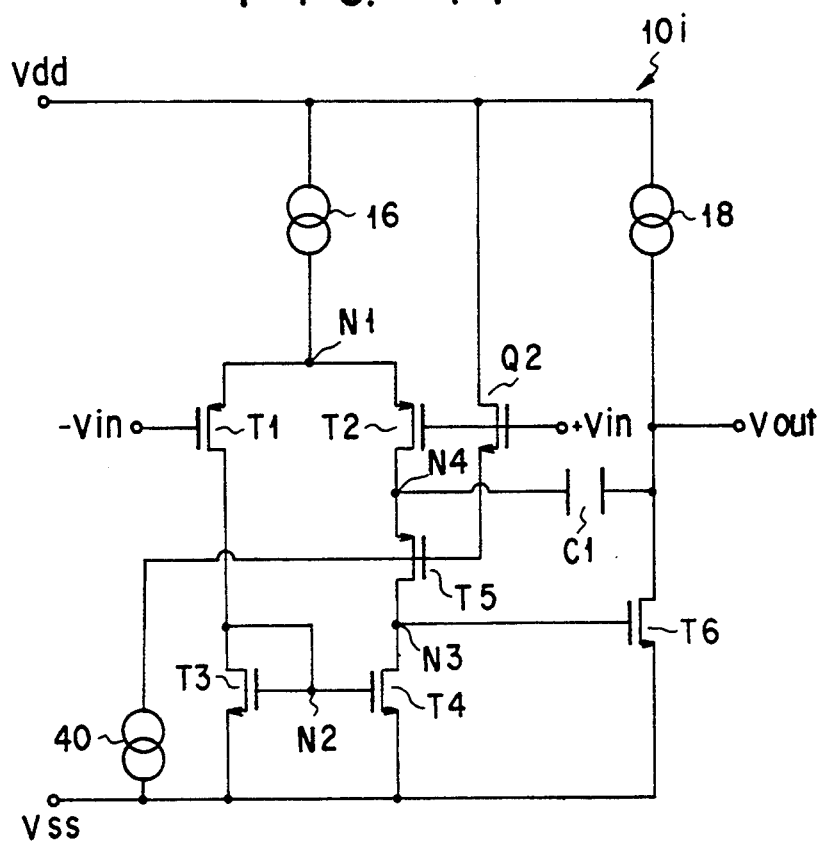
F I G. 12

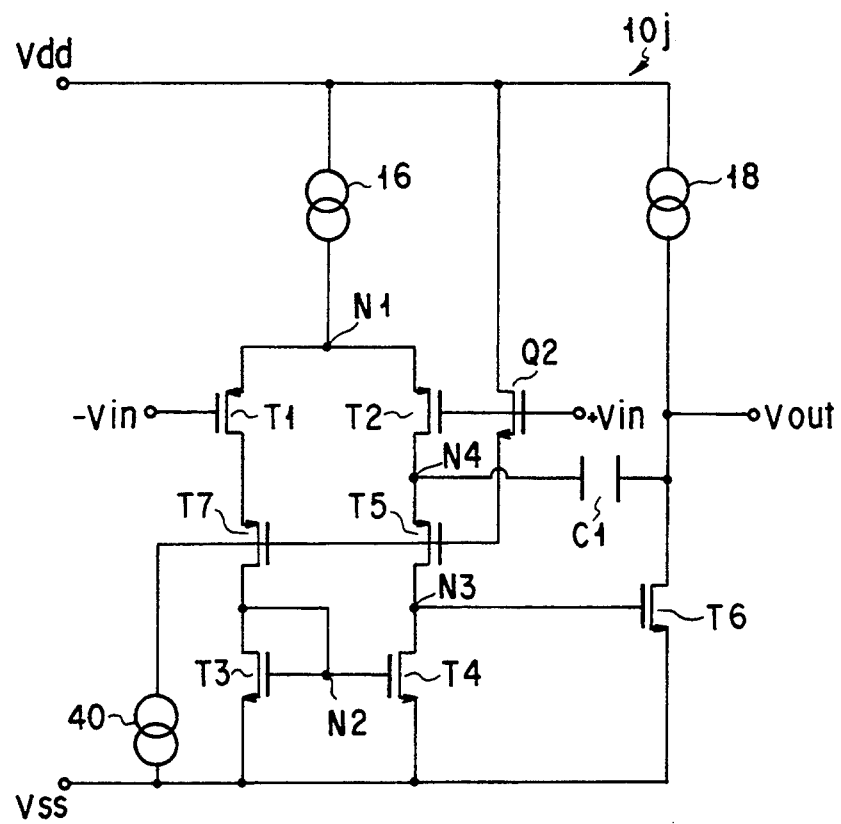
F I G. 13
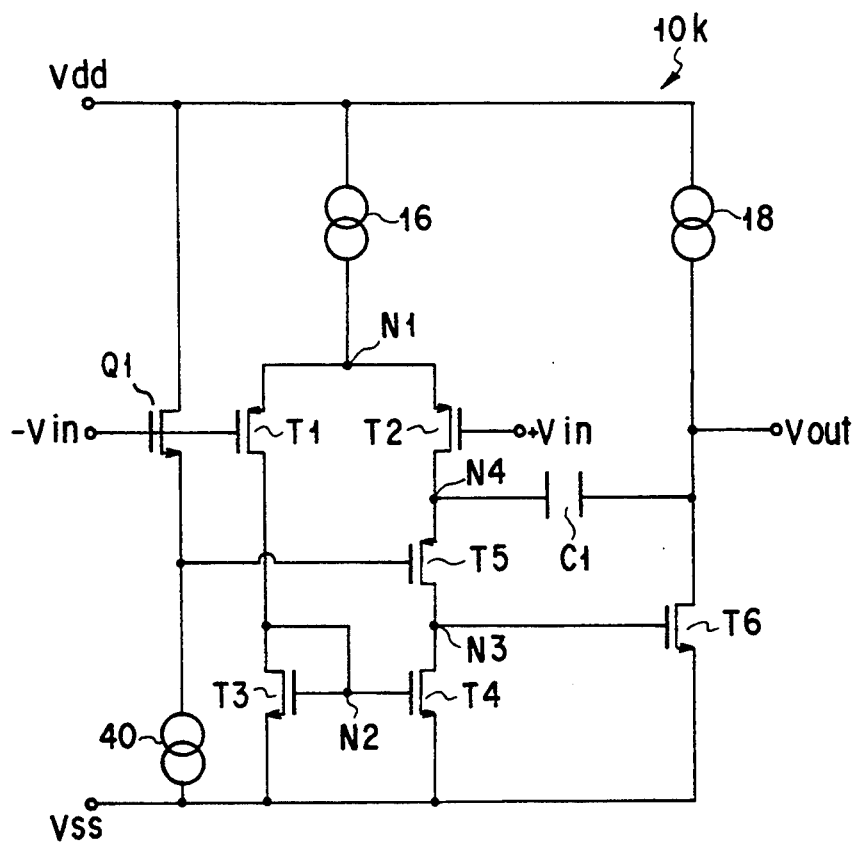
F I G. 14

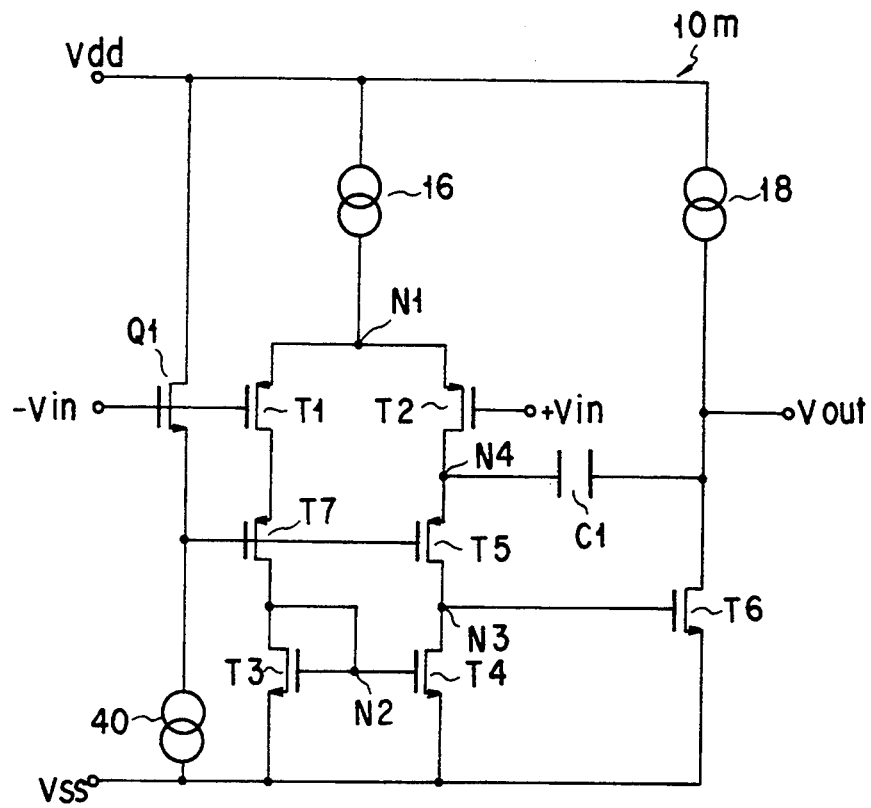
F I G. 15
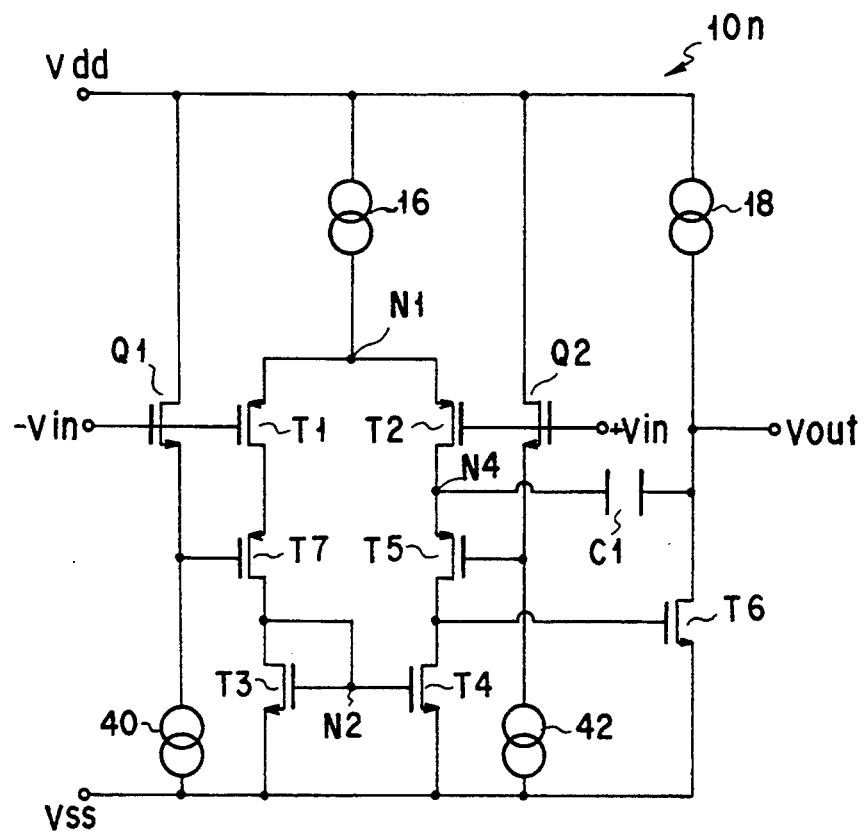
F I G. 16

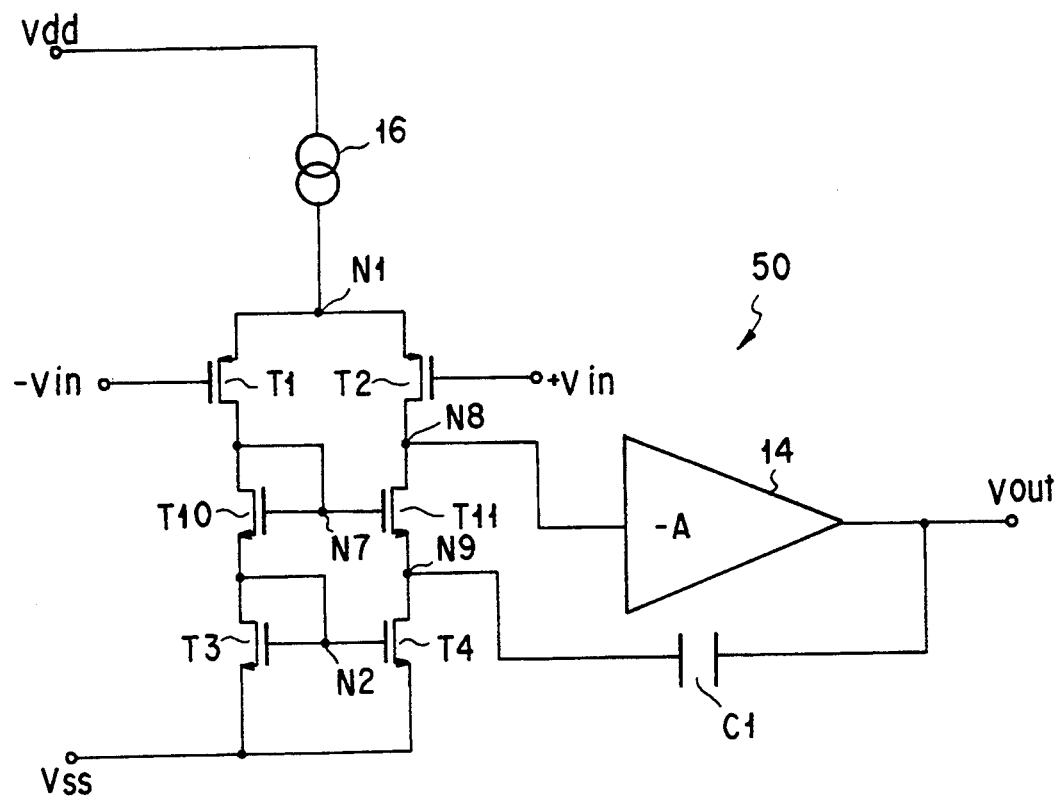
F I G. 17
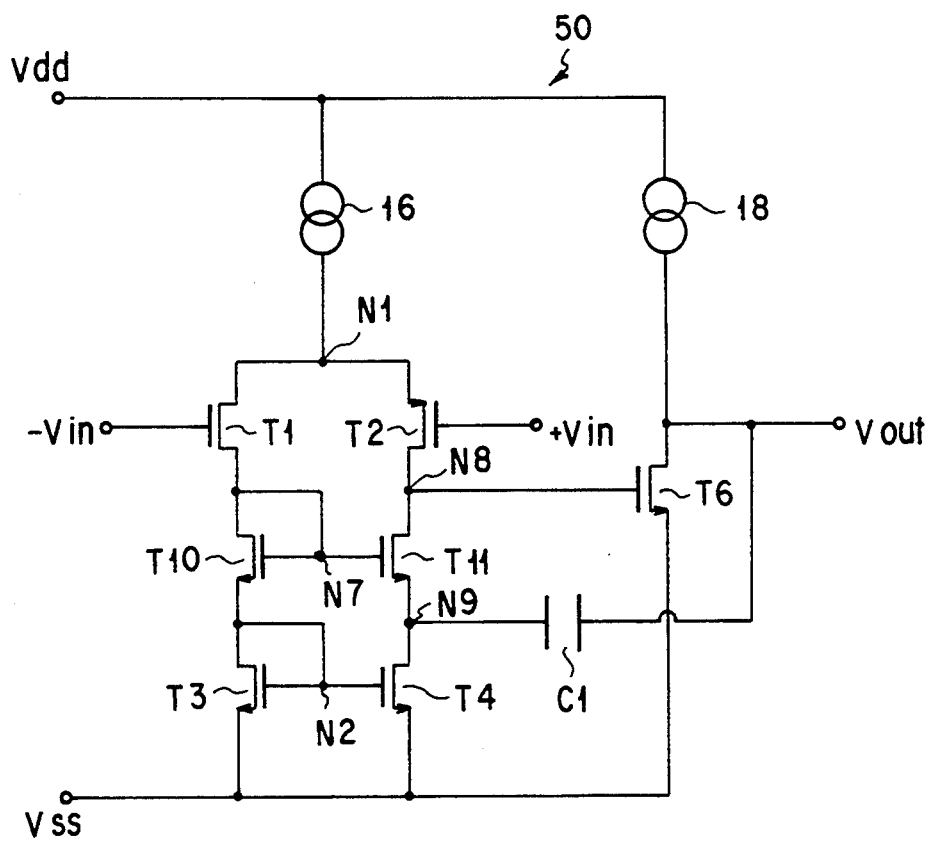
F I G. 18

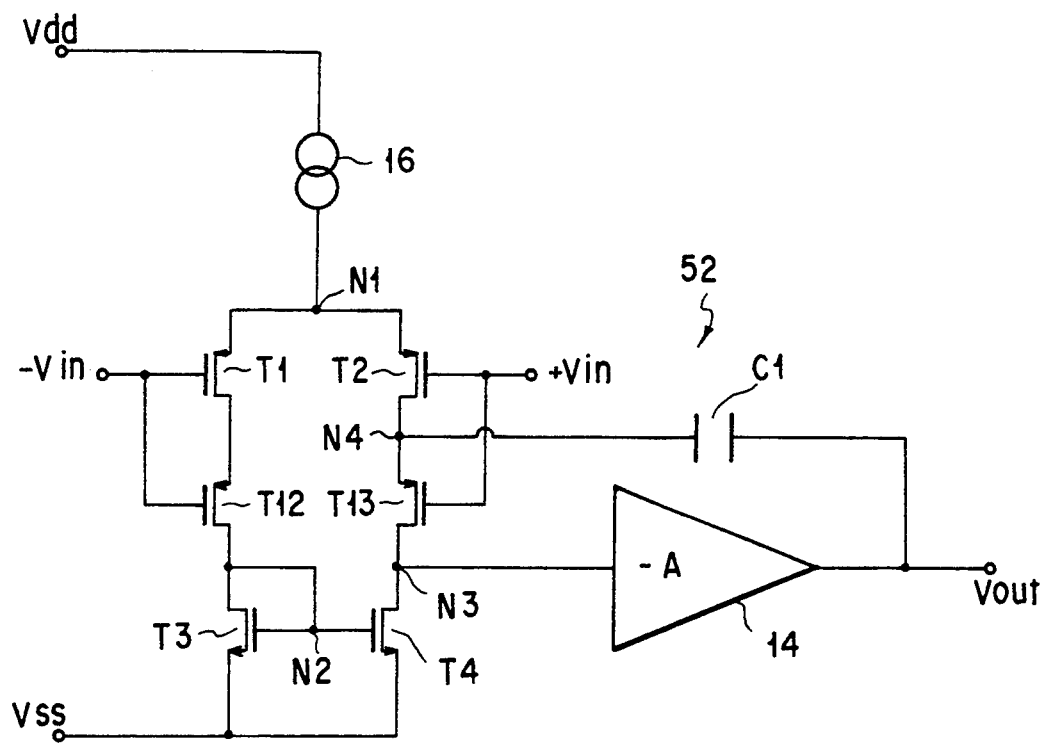
F I G. 19
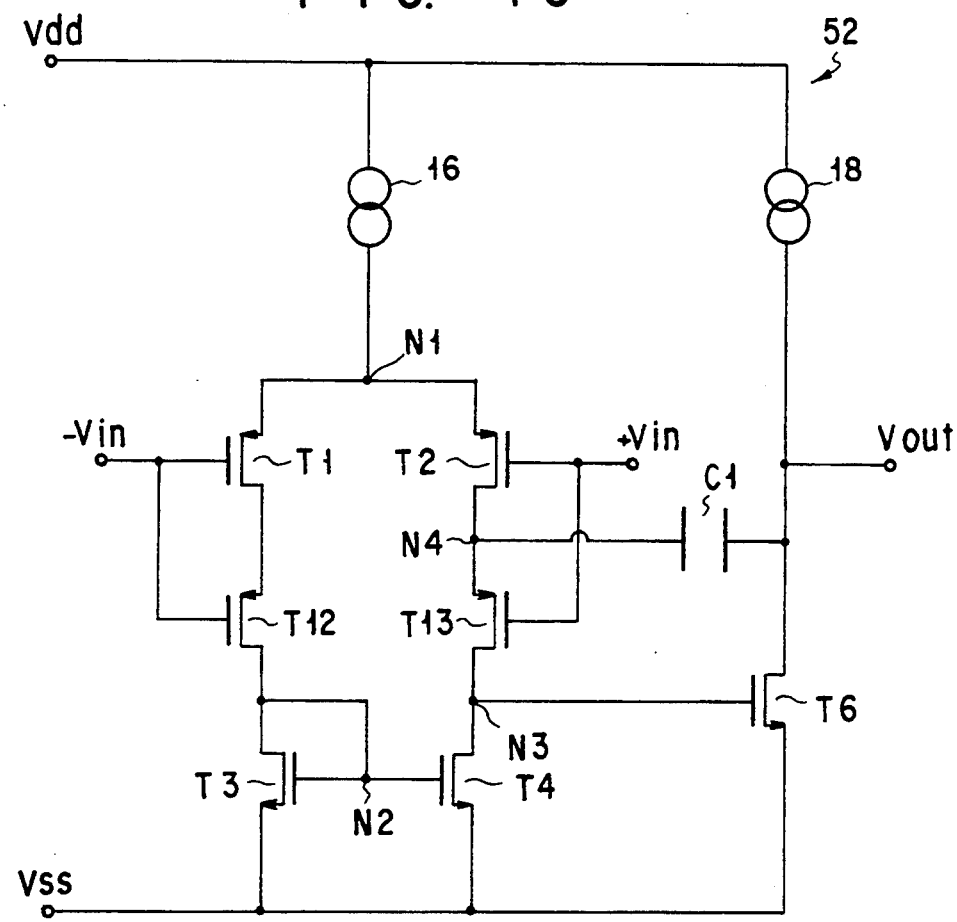
F I G. 20

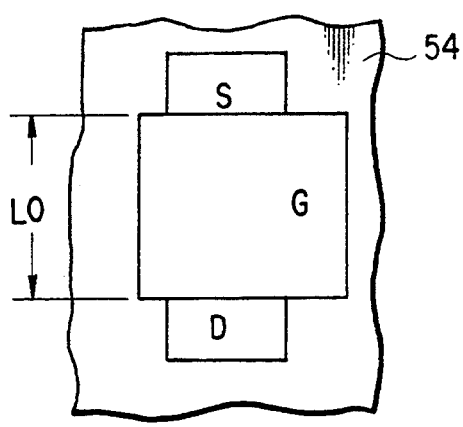
F I G. 21A
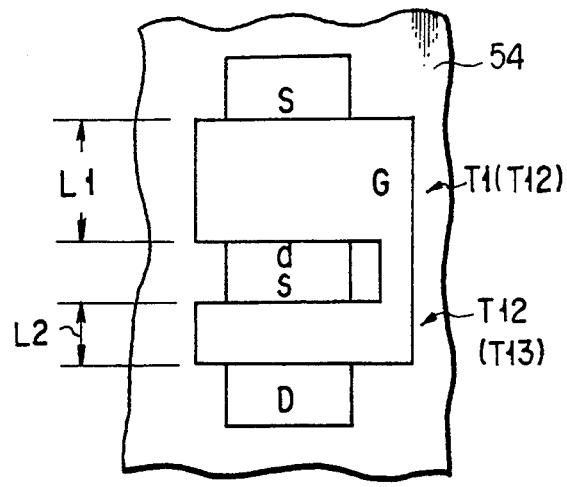
F I G. 21B
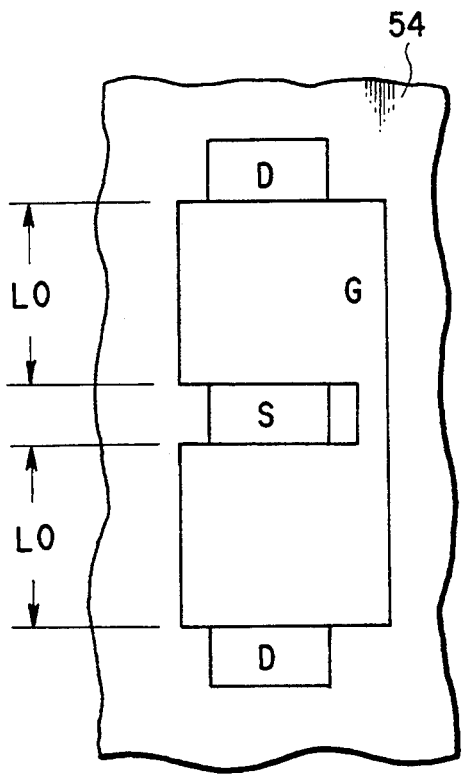
F I G. 22A
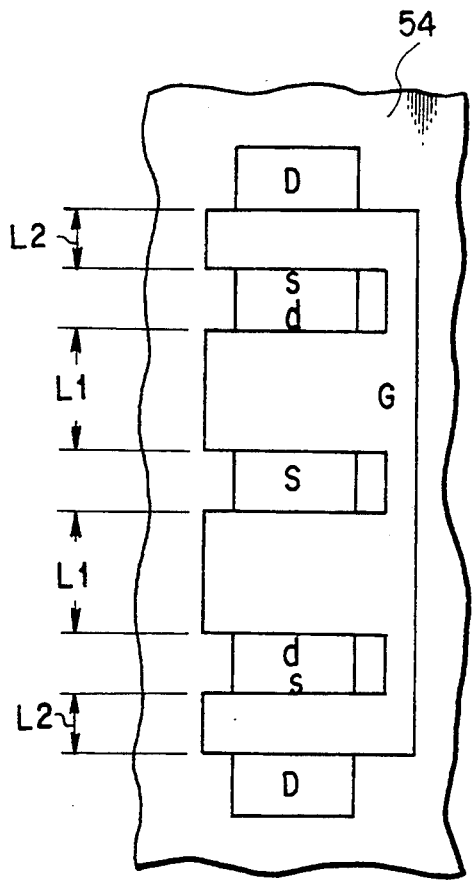
F I G. 22B

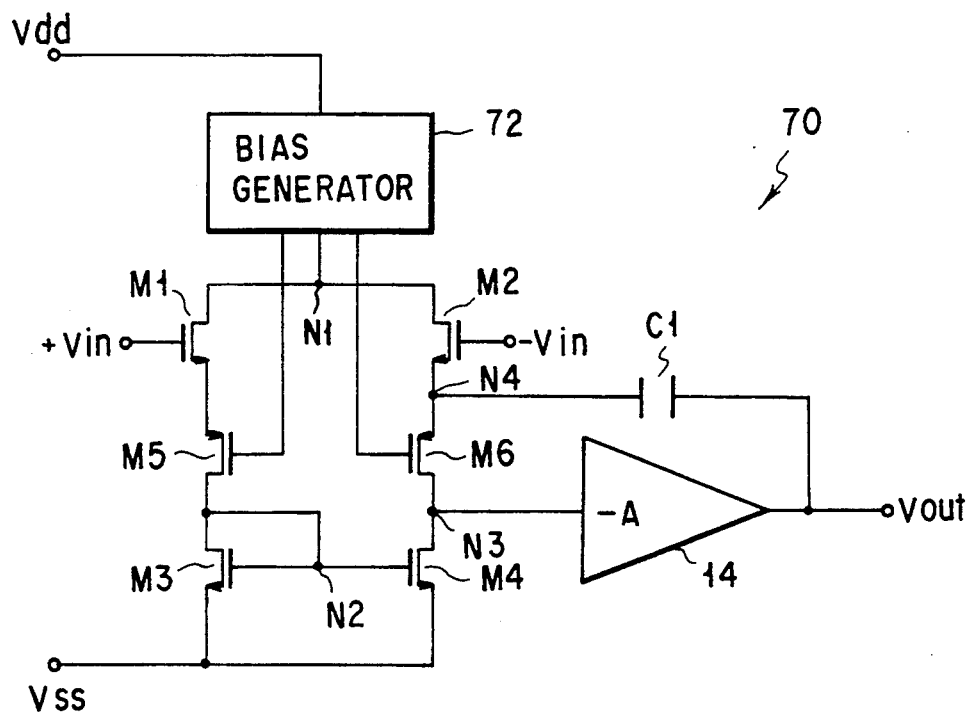
F I G. 25
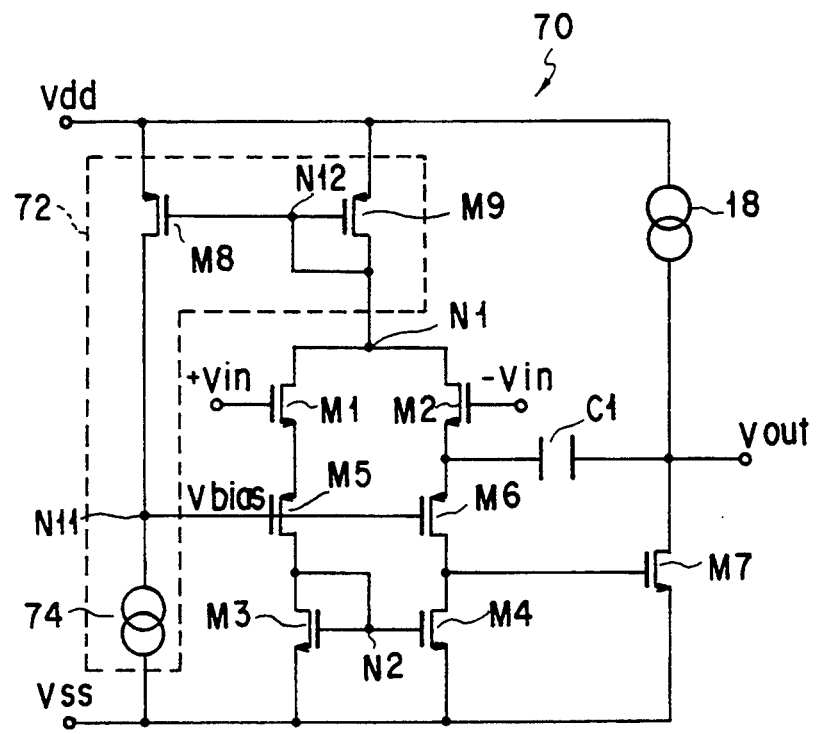
F I G. 26

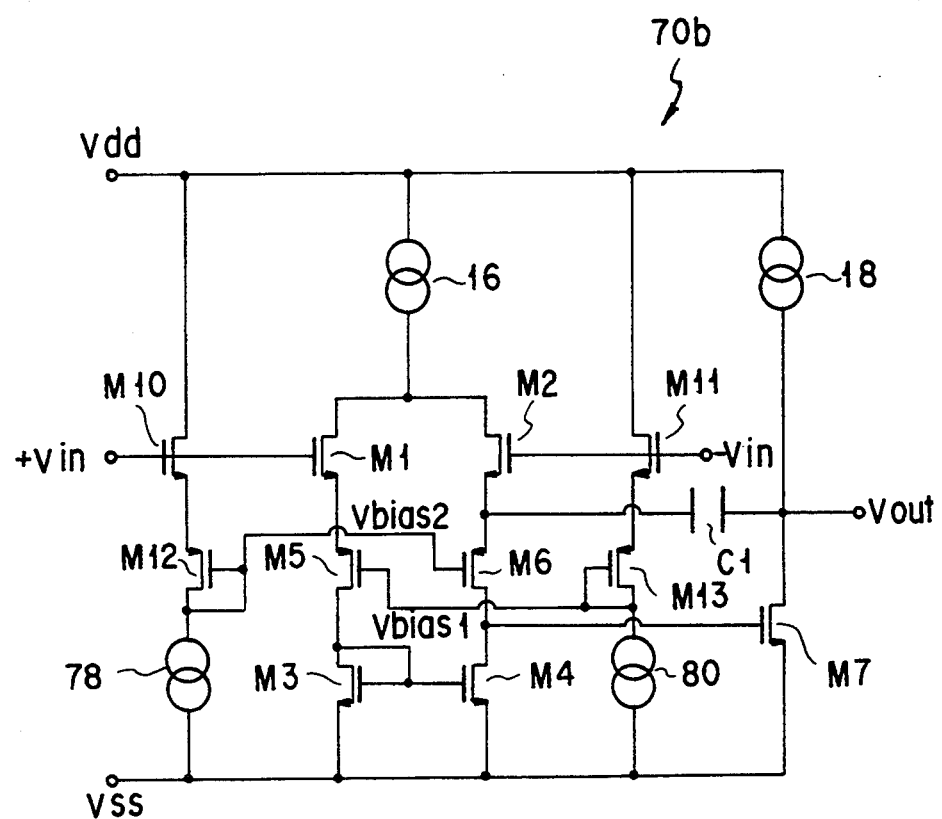
F I G. 29

OPERATIONAL AMPLIFIER CIRCUIT WITH VARIABLE BIAS DRIVEN FEEDBACK VOLTAGE CONTROLLER

BACKGROUND OF THE INVENTION

1. Field of the Invention

The present invention relates generally to analog integrated circuit (IC) devices, and more particularly to an amplifier circuit for driving a capacitive load.

2. Description of the Related Art

Recently, in the manufacture of integrated circuit (IC) devices, there are no limits in requirement and demand for further improvements in the integration density and further enhancements of the performance of IC devices. In addition to such requirements, amplifier IC devices are required to attain an improved driving capability that enables them to drive an increased capacitive load while maintaining an improved frequency characteristic. Of the amplifier circuits, operational amplifiers (op amps) have wide applicability and are becoming important more and more for the semiconductor manufacturers.

A presently available operational amplifier circuit for a capacitive load drive typically includes two stages of amplifier sections. The first-stage amplifier may be a differential amplifier coupled to the second-stage amplifier section, which provides a negative feed-back path to the differential amplifier. In the feedback path from the output of the second amplifier section to that of the first amplifier section, a capacitor is inserted which performs a phase compensation for the operational amplifier circuit.

Several techniques have been studied to improve the frequency characteristic of an operational amplifier circuit for driving an increased capacitive load. One of such techniques is disclosed, for example, in Paul R. Gray and Robert G. Meyer, "Analysis and Design of Analog Integrated Circuits," John Wiley & Sons, Chapter 12, 1984. The technique disclosed therein is a "transmission zero" point shift technique that shifts or moves the zero point, by using a transistor added to an operational amplifier, from the positive polarity region (right half plane) to the negative polarity region (left half plane) in the frequency domain called the "S-plane" among those skilled in the amplifier art. The added transistor is connected in series to the phase-compensation capacitor. The transistor functions as a resistor for forcing the zero-point to be shifted in the negative polarity region. With this prior art, however, no improvements can be expected with respect to the second pole. Therefore, a large compensation capacitor is necessary to drive a large capacitive load, which leads to an undesirable decrease in the slew rate and also to an increase in circuit-occupation area on an IC chip for the operational amplifier.

Another prior art technique may be found in Bhupendra K. Ahuja, "An Improved Frequency Compensation Technique for CMOS Operational Amplifiers," IEEE Journal of Solid-State Circuits, Vol. SC-18, No. 6, Dec. 1983, at pp. 629–633. The frequency characteristic improving technique disclosed therein is different from the Gray et al's technique in that, while the Gray et al's operational amplifier includes a feedback path that feeds back a current proportional to the time-derivative of a difference between the outputs of the first- and second-stage amplifier sections, the Ahuja's operational amplifier uses a current that is proportional to the time-derivative of the output of the second amplifier section itself, as a feedback current fed back to the first-stage amplifier section, as shown in FIG. 3(a).

With the prior art, a specific frequency pole called the "second pole" can be shifted toward a higher frequency region, thereby to improve the frequency characteristic of the operational amplifier. In addition, there is no degradation of the phase characteristic, because the generation of any transmission zero point does not take place in the right half plane of the S-plane. However, the prior art suffers from an undesirable input offset voltage, which is due to a miss-match in the current value that takes place between a current source I1 being coupled to the drain side of an additional transistor and a current source I2 being coupled to the source side thereof when the output currents of these current sources I1, I2 are different from each other.

A still another frequency characteristic improving technique is disclosed in David B. Ribner and Miles A. Copeland, "Design Techniques for Cascoded CMOS Op Amps with Improved PSRR and Common-Mode Input Range," IEEE Journal of Solid-State Circuits, Vol. SC-19, No. 6, Dec. 1984, at pp. 919–925. With an operational amplifier disclosed therein, transistors are added between a differential pair and an active load, thereby reducing the impedance at the feedback node of negative feedback network. The reduced impedance allows that the feedback current approximates the proportional current to an output voltage of differential amplifier. As a result, the second pole can be shifted toward higher frequency region as in the previous case.

With such an arrangement, the added transistors are driven by a constant voltage having a fixed potential level, which is applied to the gate electrode of the added transistors. Employing such fixed bias voltage may limit the common-mode input range of the differential amplifier. In other words, using a buffer circuit having a voltage-follower circuit configuration may limit the dynamic range of input signals. In addition, the supply of the constant bias voltage requires that a bias generator circuitry is externally arranged and connected to the transistors. Such external bias generator is necessary, because, if this constant bias generator is arranged within the operational amplifier, the resultant circuit scale of the operational amplifier becomes larger, which will make it difficult to meet the requirements of attaining higher integration density.

SUMMARY OF THE INVENTION

It is therefore an object of the present invention to provide a new and improved amplifier circuit device.

It is another object of the invention to provide a new and improved amplifier circuit which can enhance the frequency characteristic while having the signal input characteristic excellent.

It is still another object of the invention to provide a new and improved operational amplifier circuit which can drive an increased capacitive load and which can enhance the frequency characteristic while maintaining an excellent signal input characteristic of it.

In accordance with the above objects, the present invention is drawn to a specific amplifier circuit device, which includes first and second charge-transfer actuable devices forming a differential amplifier. Each actuable device has first and second current-carrying electrodes and a control electrode. The first current-carrying electrodes of the actuable devices are coupled to a current source, such as a power supply voltage. The control electrodes of the first and second actuable devices are used as first and second inputs of the differential amplifier, respectively. An active load section is coupled to the first actuable device at the second current-carrying electrode thereof. A feedback section is provided for causing a current being proportional to the time-derivative of an output of the amplifier to be partially fed back thereto. An impedance-lowering section is provided for suppressing or preventing a voltage at a feedback node from varying in potential. A bias section provides the impedance-lowering section with a bias voltage that may vary potentially in response to a variation in at least one of input signals supplied to the first and second inputs.

The foregoing and other objects, features and advantages of the invention will become apparent from the following more particular description of preferred embodiments of the invention, as illustrated in the accompanying drawings.

DETAILED DESCRIPTION OF THE PREFERRED EMBODIMENTS

FIG. 1 is a diagram showing a basic circuit configuration of one embodiment of a CMOS differential amplifier with a variable-bias driven negative feedback according to the principles of the present invention.

FIG. 2 illustrates a detailed circuit arrangement of the differential amplifier of FIG. 1.

FIGS. 4 to 9 are diagrams showing other embodiments of CMOS differential amplifier with variable-bias drive according to the principles of the present invention.

FIGS. 10 to 16 are diagrams showing further embodiments of CMOS differential amplifiers with variable-bias drive according to the principles of the present invention.

FIGS. 17 and 19 show further embodiments of CMOS differential amplifier circuits of the present invention, FIGS. 18 and 20 illustrate detailed circuit arrangements of the circuits of the preceding figures.

FIG. 21A is a diagram showing the plan views of a one-transistor area of an IC-chip substrate, and FIG. 21B illustrates two divided transistors corresponding in area to the transistor of FIG. 21A.

FIG. 22A is a diagram showing the plan views of a series-connected two-transistor area of an IC-chip substrate, and FIG. 22B shows four further-divided transistors corresponding in area to the transistors of FIG. 22A.

FIGS. 25 and 27 show still further embodiments of CMOS differential amplifier circuits of the present invention, FIGS. 26 and 28 illustrate detailed circuit arrangements of the circuits of the preceding figures.

FIG. 29 illustrates a modification of the embodiment shown in FIG. 28.

DETAILED DESCRIPTION OF THE PREFERRED EMBODIMENTS

Figure 3:
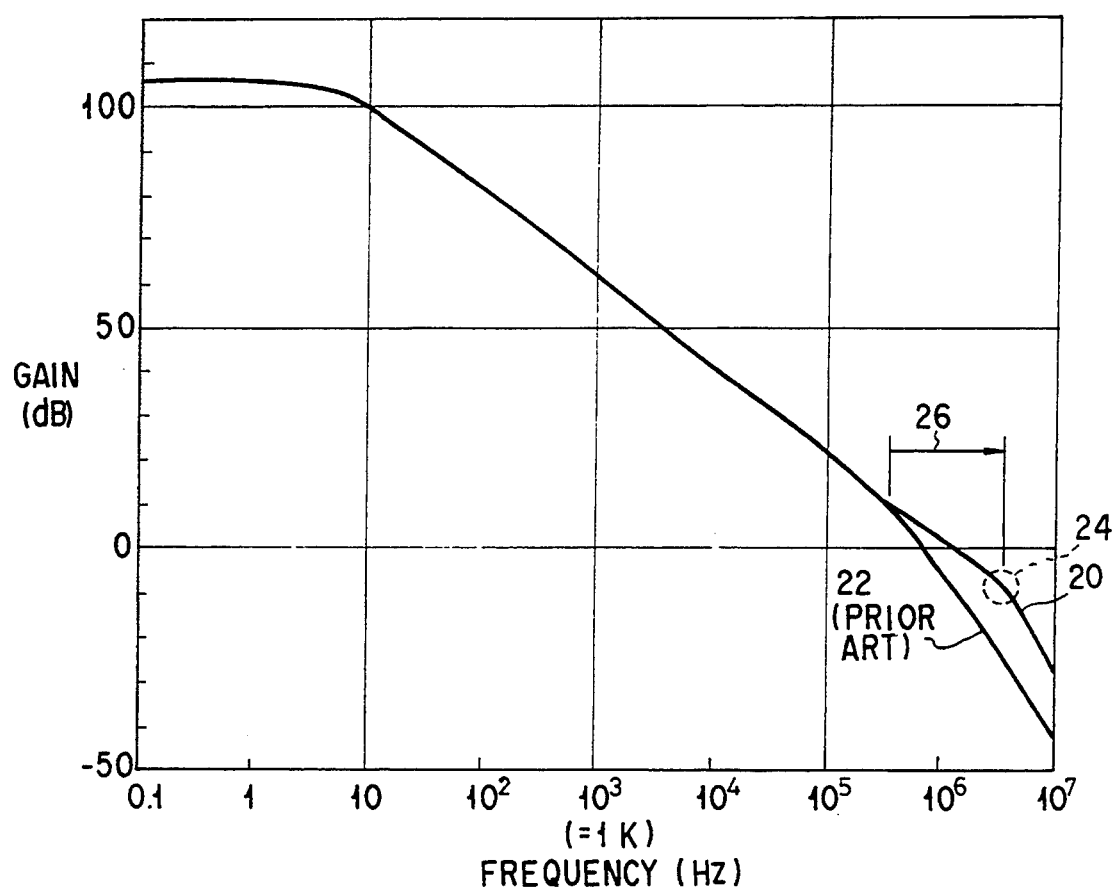
FIG. 3 is a characteristic diagram showing a simulation result of the gain versus frequency relation of the embodiment shown in FIG. 2.

Referring now to FIG. 1, an operational amplifier circuit in accordance with one preferred embodiment of the present invention is generally designated by the numeral 10. The operational amplifier 10 includes a first-stage amplifier section 12 and a second-stage amplifier section 14. The first-stage amplifier 12 includes a differential amplifier with an inverting input and a non-inverting input. The second-stage amplifier section 14 includes an inversion amplifier for negative feedback. First-stage amplifier section 12 includes a plurality of semiconductor charge-transfer actuable devices T1 to T4, which are electrically fed by a current source 16. These devices may be metal oxide semiconductor field effect transistors (MOSFETs).

The current source 16 is connected between a power supply terminal Vdd and a circuit node N1, which is coupled to the commonly-connected current-carrying electrodes (sources) of the MOS transistors T1 and T2. These MOS transistors constitute a differential transistor pair. MOS transistors T1, T2 have gate electrodes connected to an inverting input terminal and a non-inverting input terminal, to which input voltage signals −Vin, +Vin are supplied respectively. Transistor T1 is connected in series to MOS transistor T3; transistor T2 is series-connected to MOS transistor T4. Transistors T3, T4 have gate electrodes coupled together at a circuit node N2, thereby to constitute a current-mirror circuit that serves as an active load for the differential transistor pair T1, T2. The gate electrode of transistor T3 is coupled to a drain electrode thereof. Each of active-load transistors T3, T4 is connected to a ground potential terminal Vss at source electrodes thereof. Transistors T1, T2 are same in channel-conductivity type as each other; these are P-channel type transistors in this embodiment. Transistors T3, T4 are of the N channel type.

As shown in FIG. 1, an additional P-channel type MOS transistor T5 is inserted between the MOS transistors T2, T4 to have a source electrode coupled to a drain of MOS transistor T2, and a drain electrode connected to a drain of transistor T4 at a circuit node N3, to which the second-stage amplifier 14 is connected at an input thereof. The gate electrode of transistor T5 is coupled to the node N2.

The second-stage amplifier 14 has an output coupled to a signal output terminal Vout. A capacitor C1 is provided to have two insulated terminals, one of which is connected to the output of amplifier 14 and the other of which is coupled to a circuit node N4 of the MOS transistors T2, T5 as shown in FIG. 1. Capacitor C1 is provided to perform a phase compensation in a negative feedback path of the operational amplifier 10.

With such an arrangement, the source electrode of the additional MOS transistor T5 remains lower in gain than the drain electrode of transistor T4. Therefore, the source (N4) of transistor T5 is less in signal potential variation than the drain (N3) of transistor T4. This may allow one to assume that the source node N4 of transistor T5 is AC-grounded. A current that is proportional to the time-derivative of an output voltage of the second-stage amplifier 14 itself is fed back through capacitor C1 to the output of first-stage amplifier 12, that is, common-connection node N4 of MOS transistors T2, T5. The current feedback causes a frequency pole called the "second pole" to be moved or shifted toward a higher frequency region. It is thus possible to attain an improved frequency characteristic of the operational amplifier 10.

The significant features of the operational amplifier circuit 10 shown in FIG. 1 are as follows. The additional transistor T5 is driven by a variable bias voltage Vbias, which may vary in potential in accordance with the signal levels of an inverting input signal −Vin and of a non-inverting input signal +Vin as being supplied to operational amplifier 10. It can thus be eliminated that the bias drive of the additional "stabilizer" transistor T5 limits the common-mode input range. This may lead to the possibility to maximize the improvement in frequency characteristic while maintaining an excellent input signal characteristic of the operational amplifier 10. Furthermore, the supply of the variable bias voltage Vbias can be simply achieved by coupling the gate electrode of transistor T5 to the common connection node N2 of the active-load transistors T3, T4, and to the drain electrode of transistor T1, which is an output of differential amplifier 12 other than the feedback output N4 and connected to the active-load transistor T3. Basically, no extra circuits are required to supply transistor T5 with the variable bias voltage Vbias. This enables operational amplifier 10 to be made up of the minimized number of circuit components, which leads to accomplishment of higher integration density, causing the amplifier to expand its applicability.

Note here that, strictly speaking, a difference in the drain-to-source voltage possibly occurs between the transistors T1, T2 due to the gate-to-source voltage of the additional transistor T5. Such voltage difference may cause an off-set to take place undesirably in the input voltages at the differential input stage. However, from the viewpoint of practical application, such off-set problem will not be so serious, because the influence of such off-set can be neglected in the vicinity of the operating point of the operational amplifier 10 of FIG. 1, if it is used as a buffer circuit in the form of a voltage follower.

The operational amplifier 10 of FIG. 1 may be arranged as shown in FIG. 2, wherein the second-stage inversion amplifier section 14 consists of a series circuit of a current source 18 and an N-channel type MOS transistor T6. The series circuit is connected between the power supply voltage Vdd terminal and the ground potential Vss terminal. Transistor T6 has a drain electrode coupled to the output voltage Vout and also to node N4 through compensation capacitor C1.

A resultant gain versus frequency characteristic of the operational amplifier circuit 10 of FIG. 2 is shown in FIG. 3, which is the experimental results using computer simulation. In the characteristic diagram of FIG. 3, a curve 20 indicates a frequency characteristic of the embodiment employing the variable-bias driven transistor T5; a curve 22 shows that of an operational amplifier of the prior art. It is apparent from FIG. 3 that, with the embodiment 10, the second pole 24 is shifted from the position of the prior art toward higher frequency region (by about the order of magnitude) as indicated by an arrow 26, causing the value of corresponding pole gain to decrease to have the negative polarity. In other words, the gain of the second pole cab be less than zero. This may demonstrate the fact that operational amplifier 10 can operate stably even in the higher frequency region.

Figure 4:
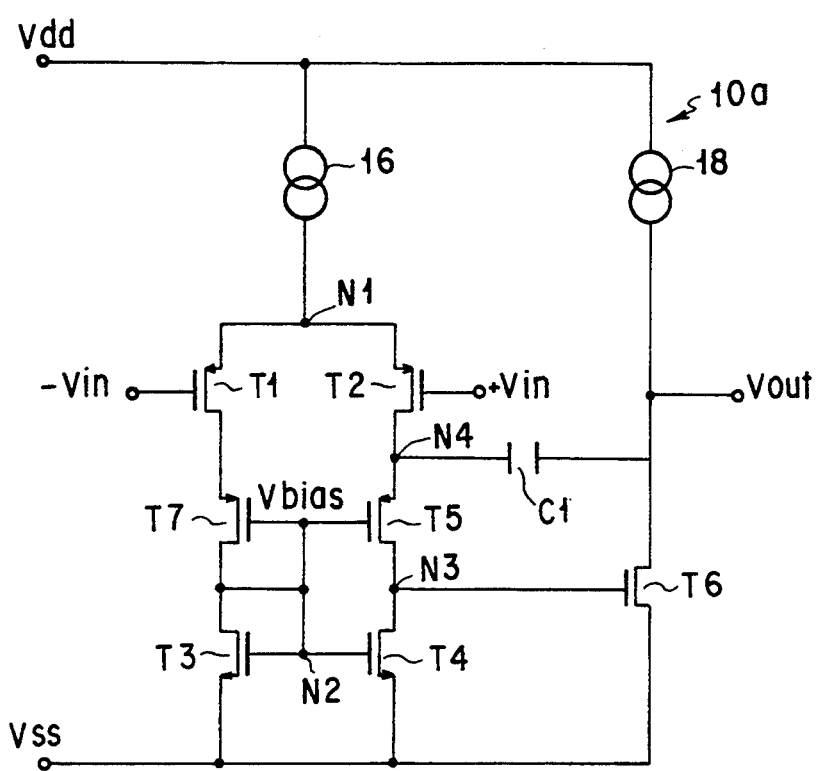

A CMOS operational amplifier circuit 10a shown in FIG. 4 is similar to that of FIG. 2 with a MOS transistor T7 being inserted between the MOS transistors T1, T3. MOS transistor T7 is same as the transistor T5 in channel conductivity type, that is, P-channel type. Transistor T7 has a source electrode coupled to the drain of transistor T1, and a drain electrode connected to the drain of active-load transistor T3. The gate electrode of transistor T7 is coupled to the gate of additional transistor T5 and the node N2. Adding of transistor T7 can enhance the equilibrium of operationability at the right and left sides of current-mirror transistor circuit (T3, T4) constituting the active load section. The consistency in operation can be improved between the both sides of the differential amplifier section of operational amplifier 10a, thereby holding balance of operation in the inverting and non-inverting inputs. This can reduce the difference in source-to-drain voltage between the transistors T1, T2 forming the differential pair, thereby to suppress or eliminate the generation of a potential off-set phenomenon.

A CMOS operational amplifier circuit 10b shown in FIG. 5 is similar to that of FIG. 4 with the MOS transistor T7 being replaced by a MOS transistor T7a of the opposite channel-conductivity type, i.e., N-channel type. Transistor T7a has a drain electrode and a gate electrode being coupled together at a circuit node N5. Also with such an arrangement, similar technical advantages can be obtained.

A CMOS operational amplifier circuit 10c shown in FIG. 6 is a modification of that of FIG. 2. This amplifier circuit is similar to the circuit 10 of FIG. 2 with the active load section including a current source 30 and an N-channel type MOS transistor T8 in addition to the MOS transistors T3, T4. More specifically, current source 30 is coupled between the node N2 (the common gate connection node of transistors T3, T4) and the ground potential Vss. MOS transistor T8 has a source electrode connected to node N2, a drain electrode coupled to the power supply voltage Vdd, and a gate electrode connected to the drain electrodes of transistors T1, T3 at a circuit node N6.

The circuit arrangement for the active load section may also function as a variable bias generating circuit for the additional transistor T5. It is thus possible, by suitably determining the source-to-gate voltage of transistor T8, to reduce the drain-to-source voltage difference between transistors T1, T2 constituting the differential pair, while attaining similar technical advantages in the operational amplifier 10a of FIG. 4. Such reduction in the voltage difference can minimize the generation of a potential off-set in the differential stage of operational amplifier circuit 10c.

Another modification of the CMOS operational amplifier circuit 10 of FIG. 2 is shown in FIG. 7. The significant feature of this circuit 10d is that a low-pass-filter (LPF) circuit 32 is added between the gate electrode of the MOSFET T5 and the variable-bias generation circuit therefor. Low-pass filter 32 is connected to the node N2 and the gate electrode of the transistor T5. With such an arrangement, the gate electrode of transistor T5 can be suppressed or prevented from varying in potential, thereby suppressing or preventing a potential variation from occurring at the drain electrodes of differential-pair transistors T1, T2. This can enhance the AC-coupling performance of the negative feedback node N4 (the source electrode of additional transistor T5) to the ground potential. The frequency characteristic can thus be further improved.

In reduction to practice, the operational amplifier circuit 10d of FIG. 7 may be modified as shown in FIG. 8. A CMOS operational amplifier circuit 10e disclosed therein is similar to that of FIG. 7 with the low-pass filter 32 being constituted by an RC circuit consisting of a resistor R1 and a capacitor C2. Resistor R1 is connected between the gate electrode of the transistor T5 and the node N2. Capacitor C2 is connected between the gate of transistor T5 and the ground potential.

Figure 9:
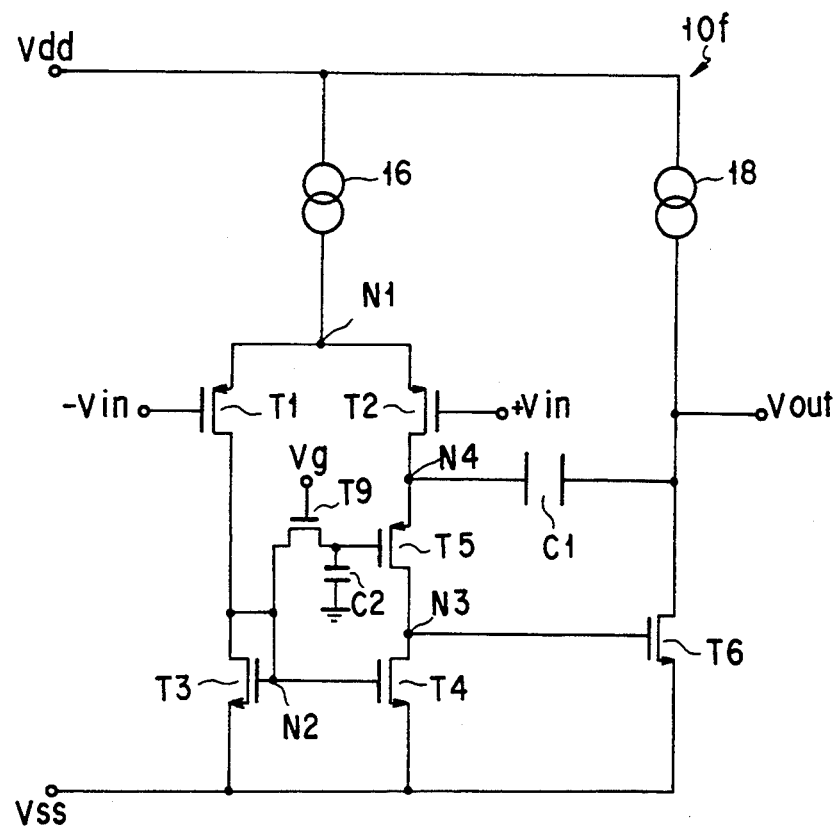

The operational amplifier circuit 10d of FIG. 7 may alternatively be modified as shown in FIG. 9, wherein a CMOS operational amplifier circuit 10f is similar to that of FIG. 8 with the resistor R1 being replaced by a MOS transistor T9. Transistor T9 has source and drain electrodes, one of which is connected to the gate of additional MOS transistor T5, and the other of which is coupled to the node N2. The gate of transistor T9 is connected to a voltage input terminal, to which a gate drive voltage Vg may be applied externally. The inherent ON-resistance of transistor T9 is utilized to provide the resistor for the low-pass filter 32 of FIG. 7.

Figure 10:
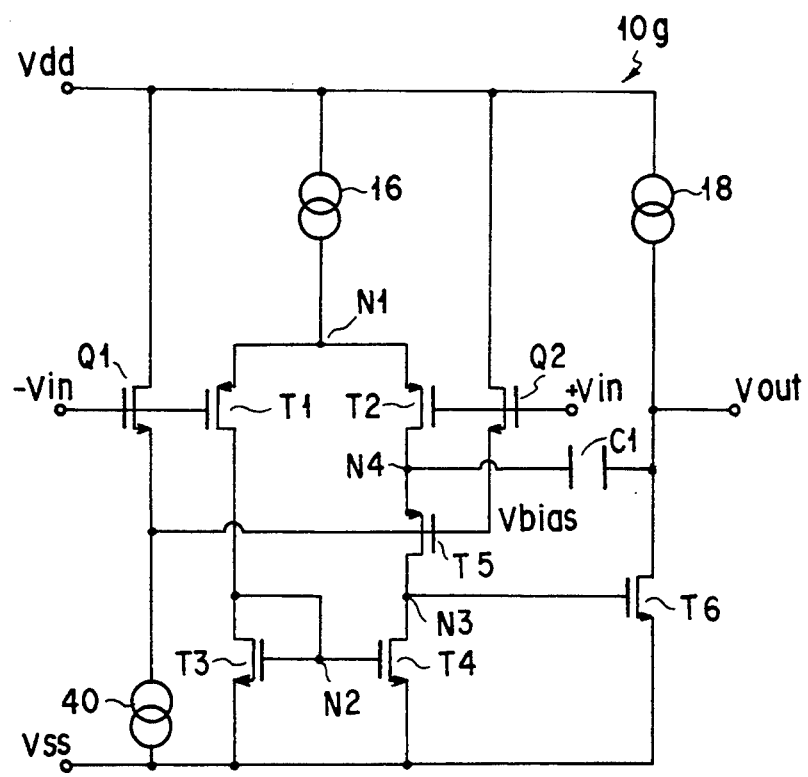

A CMOS operational amplifier circuit 10g shown in FIG. 10 is similar to that of FIG. 2 with a level-shift circuit being added to supply the MOS transistor T5 with a variable bias voltage. The level-shift circuit is connected to the gate electrode of at least one of the MOS transistors T1, T2 forming the differential pair.

More specifically, the level-shift circuit includes two N-channel MOS transistors Q1, Q2 and a current source 40 as shown in FIG. 10. Transistors Q1, Q2 have gate electrodes connected to the gate electrodes of transistors T1, T2, respectively. The drain electrodes of transistors Q1, Q2 are coupled to the power supply voltage Vdd, whereas the source electrodes of transistors Q1, Q2 are coupled together to the gate electrode of transistor T5. The current source 40 is connected between the gate electrode of transistor T5 and the ground potential Vss, as shown in FIG. 10. A level-shifted gate voltage of transistors Q1, Q2 is supplied to the gate of transistor T5 as a variable-bias voltage therefor.

According to the embodiment 10g, its differential input voltage(s) +Vin and/or −Vin may be level-shifted by the level-shift circuit that consists of the current source 40 and the pair of MOS transistors Q1, Q2. Each level-shifted voltage is supplied as a bias voltage Vbias to the gate electrode of transistor T5. The gate bias voltage of transistor T5 is thus rendered equivalent in potential level to one of the differential input voltages +Vin and −Vin which is higher than the other. Employing it as the variable bias voltage Vbias for transistor T5 can achieve an expanded allowable common-mode input range.

Six possible modifications of the CMOS operational amplifier 10g of FIG. 10 are illustrated in FIGS. 11 to 16. In the first place, regarding a CMOS operational amplifier 10h shown in FIG. 11, the further MOS transistor T7, which is employed in the embodiment 10a of FIG. 4, is added thereto. Except such arrangement, operational amplifier 10h is similar to the embodiment 10g shown in FIG. 10. The two additional transistors T5, T7 are same as each other in channel conductivity type. The gate electrodes of these transistors are connected together to the source electrodes of the transistors Q1, Q2. These gate electrodes are also coupled to the ground potential Vss by way of the current source 40. Adding of further transistor T7 can prevent any off-set voltage from taking place in the differential input section of amplifier 10h, which may lead to a further improvement in the frequency characteristic thereof.

A CMOS operational amplifier circuit 10i shown in FIG. 12 is similar to that of FIG. 10 with the first MOS transistor Q1 being deleted. Deletion of transistor Q1 provides a variable bias voltage generator including the transistor T5, which is responsive to only one (+Vin) of the two input voltages. As a result, the level-shifted gate voltage of transistor Q2 is supplied to the gate of transistor T5 as a variable bias voltage therefor.

A CMOS operational amplifier circuit 10j shown in FIG. 13 is similar to the embodiment 10h of FIG. 11 with the first MOS transistor Q1 being deleted. A CMOS operational amplifier circuit 10j shown in FIG. 14 is similar to that of FIG. 10 with the second MOS transistor Q2 being deleted. A CMOS operational amplifier circuit 10m shown in FIG. 15 is similar to that of FIG. 11 with the second MOS transistor Q2 being deleted.

A CMOS operational amplifier circuit 10n shown in FIG. 16 is similar to the embodiment 10h of FIG. 11 with (1) the gate electrodes of two additional transistors T5, T7 being electrically disconnected from each other, and (2) a current source 42 being additionally provided to be connected between the gate electrode of transistor T5 and the ground potential Vss. This results in that transistor T5 is supplied with the level-shifted gate voltage of transistor Q2, while the other transistor T7 is supplied with that of transistor Q1. With such an arrangement, the differential input voltages +Vin, −Vin at transistors Q1, Q2 can be level-shifted using separate current sources 40, 42, and transistors T5, T7 can be supplied with level-shifted gate voltages of transistors Q2, Q1 independently of each other.

A CMOS operational amplifier circuit 50 of FIG. 17 uses a cascode-connected current-mirror circuit as its active load in the first-stage amplifier section. The embodiment 50 is similar to that of FIG. 1 except the following circuit arrangements. N-channel type MOS field effect transistors T10, T11 are provided as the transistors, which are same in channel conductivity type as each other. One additional transistor T10 is inserted between the MOS transistors T1, T3; the other additional transistor T11 is added between transistors T2, T4. Transistors T10, T11 have gate electrodes coupled together at a circuit node N7. The gate of transistor T10 is coupled to a drain electrode thereof.

As shown in FIG. 17, the input of the inversion amplifier 14 is connected to a circuit node N8 whereat the drain electrodes of transistors T2, T11 are connected in common to each other. The output of amplifier 14 is connected to the output terminal Vout and is also coupled through compensation capacitor C1 to another circuit node N9, whereat the source electrode of transistor T11 is connected to the drain electrode of active-load transistor T4. With embodiment 50, the same advantages as those of the previous embodiment of FIG. 1 may be obtained in terms of the improved frequency characteristic.

A typical circuit configuration of this embodiment is shown in FIG. 18, wherein the inversion amplifier 14 is a source-grounded amplifier circuitry. The MOS transistor T6 of the inversion amplifier 14 has its gate electrode being coupled to the node N8, which is between the differential-pair transistor T2 and one stabilized transistor T11. The source electrode of transistor T6 is connected to the ground potential Vss. Capacitor C1 is connected between the output voltage Vout and the node N9, at which transistor T11 is coupled to active-load transistor T4.

A CMOS operational amplifier circuit 52 shown in FIG. 19 is similar to the embodiment 10 of FIG. 1 with the first and second additional transistors T12, T13 being provided between the differential transistor pair T1, T2 and the active load transistors T3, T4. Transistors T12, T13 are of the P-channel type. Transistor T12 has a source electrode coupled to the drain of transistor T1, a drain electrode connected to the commonly-coupled gate and drain of transistor T3 at node N2, and a gate electrode coupled to the gate of transistor T1 (or input voltage −Vin). Transistor T13 has a source electrode coupled to the drain of transistor T2, a drain electrode connected to the node N3, and a gate electrode coupled to the gate of transistor T2 (or input voltage +Vin). The input of inversion amplifier 14 is connected to node N3. The output of amplifier 14 is coupled to output voltage Vout terminal, and is also coupled to node N4 through capacitor C1. Inversion amplifier 14 may be arranged as shown in FIG. 20 so that it includes the series circuit of current source 18 and MOS transistor T6 in the same manner as in the embodiment of FIG. 1.

Very importantly, the differential-pair transistor T1 and its corresponding transistor T12 are formed in a one-transistor area on the surface of a chip substrate (not shown) of the operational amplifier 52. In other words, transistor T12 is defined by physically dividing MOS transistor T1 into two sub-transistor sections, one of which is used as differential-pair transistor T1, and the other of which is employed as the transistor T12. The same goes with the combination of transistors T2, T13. In the field of analog integrated circuit (IC) devices, such transistor division may be easily accomplished by making use of a specific gate electrode having a "one square-bracket (])"-shaped planar shape, as will be explained below.

FIG. 21A is an illustration of a typical plan view of one MOS transistor on a semiconductive chip substrate 54 of the operational amplifier circuit 52. As well known in the art of analog ICs, a MOS transistor is formed on substrate 54 in such a manner that it has spaced part heavily-doped active regions that act as the source S and drain D thereof. An insulated conductive thin film, which may be a metallic layer, overlies a substrate surface portion that is between the source and drain regions S, D. The surface portion may function as a channel region. The insulated layer has a rectangular planar shape and serves as a gate electrode G of the MOS transistor. In the case of the transistor structure of FIG. 21A, the effective gate length is represented by "L0" in FIG. 21A.

The differential-pair transistor T1 (or T2) and its corresponding transistor T12 (T13) are formed by modifying the gate electrode G of FIG. 21A so that it has a "]"-shaped pattern as shown in FIG. 21B. The two "bar" portions of "]"-shaped gate electrode define an opening, which defines two MOS transistors of the same channel-conductivity type being divided from the transistor of FIG. 21A; these two divided transistors may be used as differential-pair transistor T1 (T2) and its corresponding transistor T12 (T13). An underlying active region positioned below the opening in substrate 54 functions as both a drain d of transistor T1 and a source s of transistor T12.

With the "transistor division" feature of the operational amplifier circuit 52, the improved frequency characteristic can be attained while minimizing an increase in the substrate occupation area due to the addition of the transistors T12, T13. This enables the operational amplifier 52 to be maximized in integration density.

The transistor-division concept may also be applied to a series of two MOS transistors using a "]"-shaped gate electrode on substrate 54 as illustrated in FIG. 22A. Such arrangement is popular in the analog IC device art. Each transistor has an effective gate length L0. The gate electrode is further divided into a "comb"-shaped planar pattern, which has four "tooth" portions with the both end teeth being narrower (L2) than the remaining two intermediate teeth (L1), as shown in FIG. 22B. The relation between the gate length L0 and the divided gate lengths L1, L2 is similar to that shown in FIG. 21B: principally, L0=L1+L2. Using such "further dividing" technique for the "]"-shaped gate electrode(s) enables a resultant operational amplifier IC with the improved frequency characteristic to be further enhanced in integration density.

Figure 23:
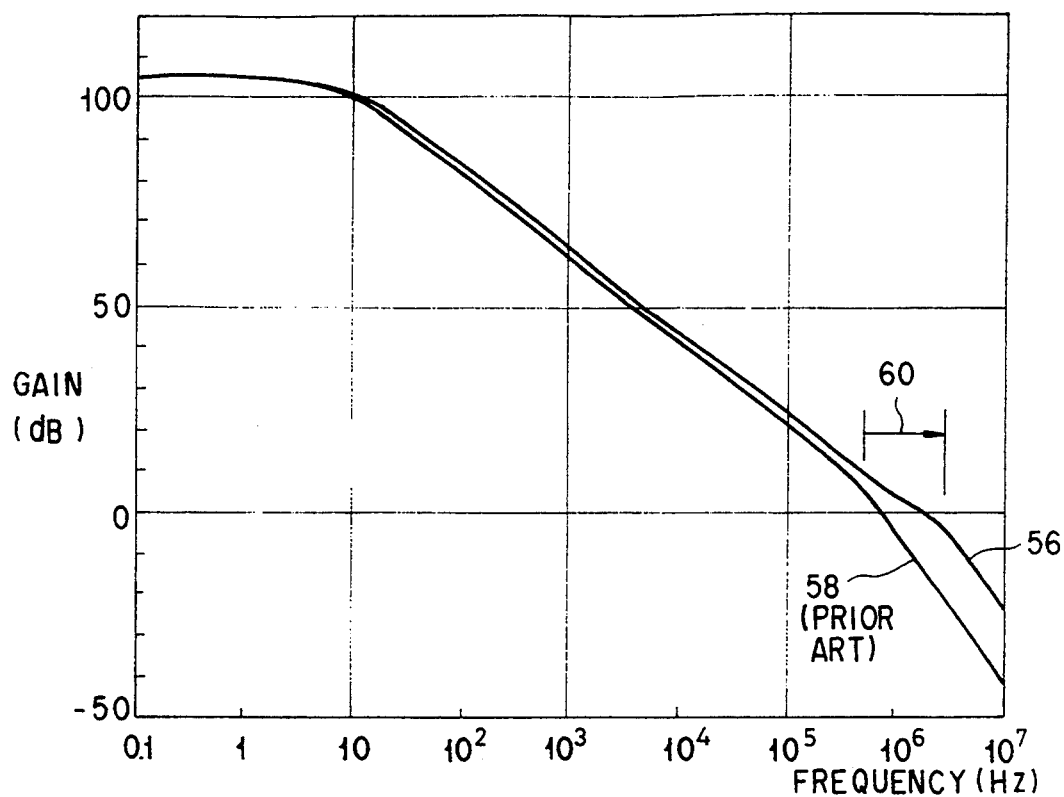
FIG. 23 is a characteristic diagram showing a simulation result of the gain versus frequency relation of the embodiment shown in FIG. 20.

The improved frequency characteristic of the embodiment 52 is shown in FIG. 23, wherein a curve 56 indicates that of embodiment 52, and a curve 58 shows that of a prior art. It is apparent from viewing this diagram, with the embodiment 52, the second pole was shifted toward high-frequency region as is designated by an arrow 60, with the result in a corresponding gain being changed in polarity from a positive value (prior art) to a negative value.

Figure 24:
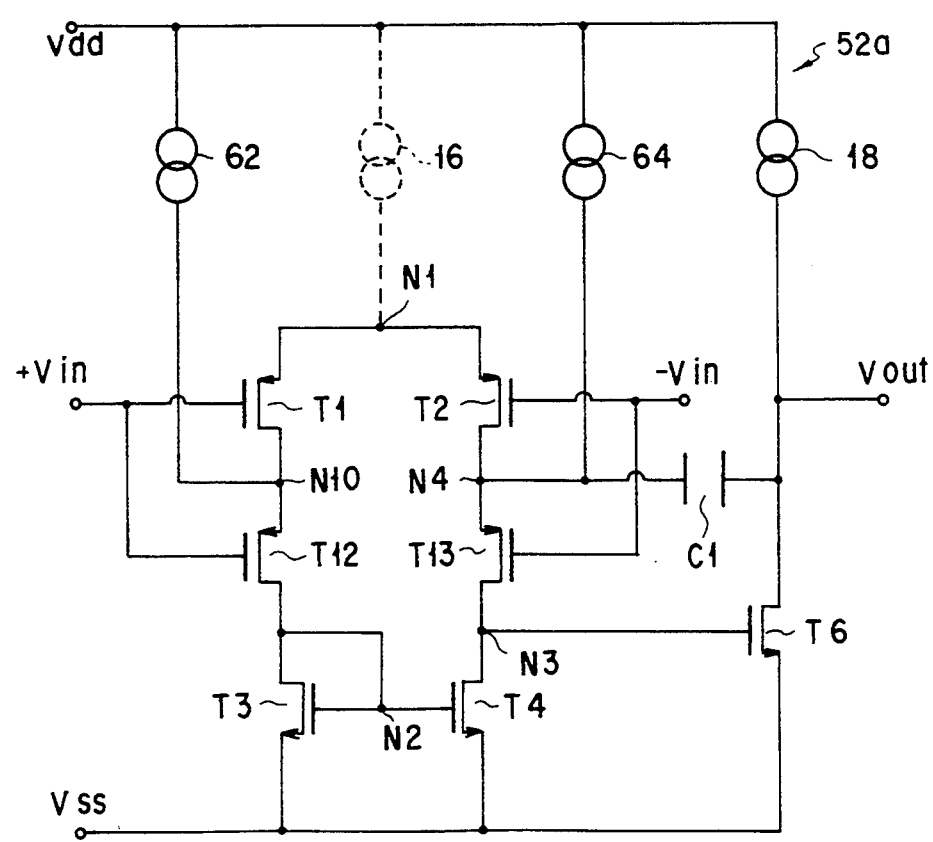
FIG. 24 shows a modification of the embodiment of FIG. 20.

A CMOS operational amplifier circuit 52a shown in FIG. 24 is similar to that of FIG. 20 with additional current sources 62, 64 being independently associated with the right- and left-sides of the combinations of differential-pair transistors T1, T2 and additional transistors T12, T13. Transistors T1, T12 are the "divided transistors" as previously described; the same goes with transistors T2, T13. A circuit node N10 may correspond to the intermediate active region s, d shown in FIG. 21B. Current source 16 may be deleted; it may alternatively be left as required.

With the embodiment 52a, the MOS transistors T1, T2 constituting the differential pair of the first-stage amplifier section are forced to turn on continuously due to the addition of the independent current sources 62, 64. This makes it possible to reduce the impedance at the compensation feedback node N4. Furthermore, the impedance can be kept smaller irrespective of the actual amplitude of the differential input signals +Vin, −Vin. This may enhance the reliability of the embodiment circuit while achieving an improved frequency characteristic thereof.

A CMOS operational amplifier circuit 70 shown in FIG. 25 includes a differential pair, which is constituted by a pair of parallel-connected MOS transistors M1, M2 of N-channel type. These transistors have source electrodes that are connected to the ground potential Vss through N-channel type MOS transistors M3, M4, respectively. The gate electrodes of transistors M1, M2 are coupled to input signal (+Vin, −Vin) supply terminals. The drain electrodes of transistors M1, M2 are coupled together at node N1, which is connected to the power supply voltage Vdd by way of a variable-bias generating circuit 72.

As shown in FIG. 25, P-channel type MOS transistors M5, M6 are provided as the transistors in such a manner that transistor M5 is connected between transistors M1, M3 and that transistor M6 is coupled between transistors M2, M4. The gate electrodes of transistors M5, M6 are coupled to bias generator 72. Node N3 is connected to the output voltage Vout terminal through inversion amplifier section 14. The output of amplifier 14 is fed back through compensation capacitor C1 to the common source node N4 of transistors M2, M6.

As shown in FIG. 26, the inversion amplifier 14 consists of a series circuit of current source 18 and an N-channel MOS transistor M7 provided between the power supply voltage Vdd and the ground potential Vss. The bias generator 72 includes a series circuit of P-channel MOS transistor M8 and a current source 74 arranged between the power supply voltage Vdd and the ground potential Vss. The gate electrodes of transistors M5, M6 are coupled to an intermediate circuit node N11 of transistor M8 and current source 74. Bias generator 72 further includes a P-channel MOS transistor M9, which has a gate electrode coupled to the gate of transistor M8, a source electrode coupled to the power supply voltage Vdd, and a drain electrode coupled to the gate thereof at a node N12. Such circuit arrangement of bias generator 72 permits the main current source (see "16" in FIG. 1) to be unnecessary, since transistor M9 performs an equivalent or corresponding current-supplying function.

The bias generator 72 can provide a specific bias voltage that may potentially vary in response to a variation in the differential input signals +Vin, −Vin. The variable bias voltage Vbias is applied to the gate electrodes of transistors M5, M6. This results in that the second pole can be shifted in the direction of higher frequency. It becomes possible to attain an improved frequency characteristic while minimizing an increase in number of the required circuit components.

Figure 27:
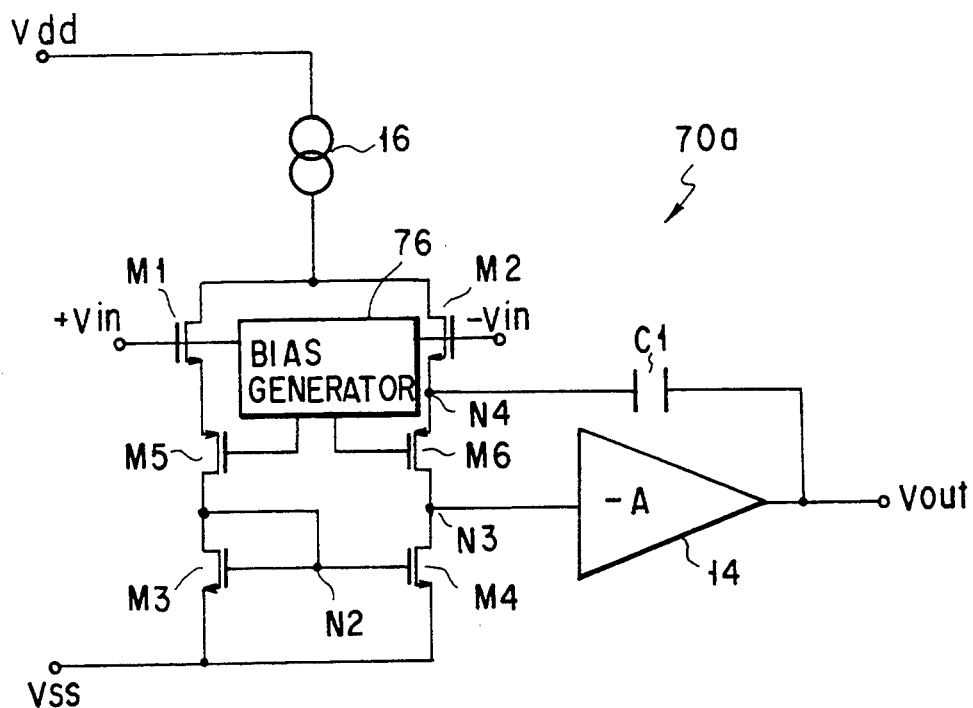
Figure 28:
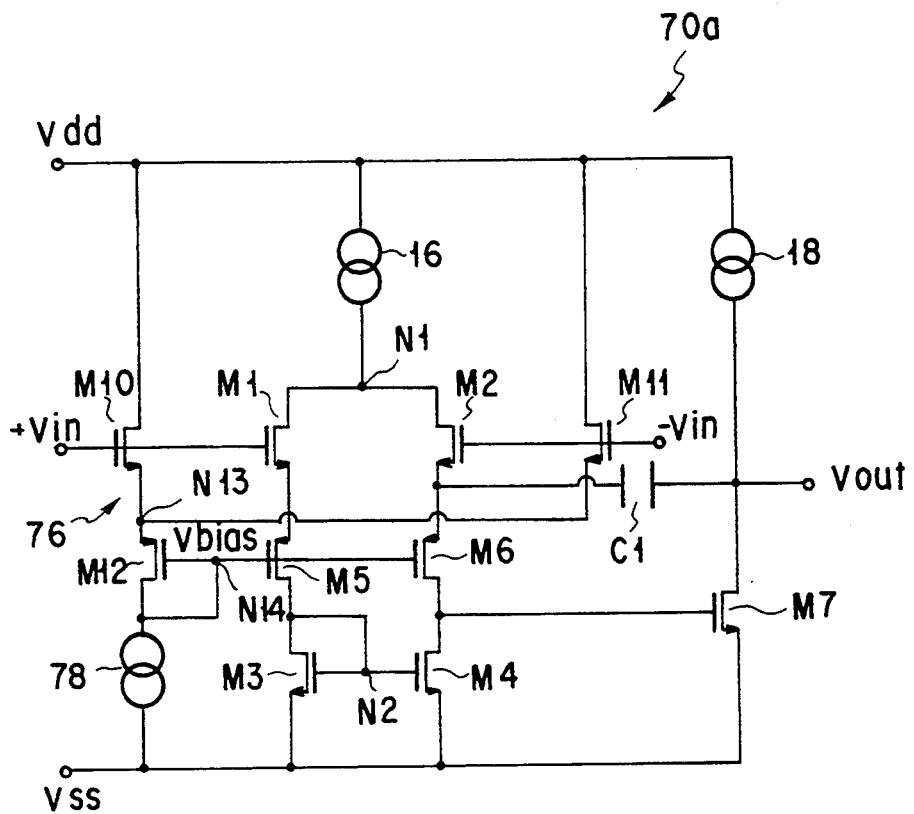

A CMOS operational amplifier circuit 70a shown in FIGS. 27 and 28 is similar to that of FIGS. 25 and 26, with the bias generation circuit 72 being replaced by another bias generation circuit 76, which is responsive to the differential input signals +Vin, −Vin. More specifically, as shown in FIG. 28, the bias generator 76 includes N-channel type MOS transistors M10, M11 having gate electrodes coupled to the inputs +Vin, −Vin, respectively. The drain electrodes of transistors M10, M11 are coupled to the power supply voltage Vdd. The sources of transistors M10, M11 are coupled together at a circuit node N13. This node is connected to the ground potential Vss by way of a series circuit of a P-channel type MOS transistor M12 and a current source 78. Transistor M12 has a gate and a drain electrode being coupled together at a node N14, which is connected to the gate electrodes of transistors M5, M6.

The bias generator of FIG. 28 may be modified as shown in FIG. 29, wherein a CMOS operational amplifier circuit 70b includes an additional series circuit of P-channel MOS transistor M13 and a current source 80. The first and second additional transistors M5, M6 are electrically separated from each other at their gate electrodes. The transistor M13 is associated with the first transistor M5, whereas transistor M12 is connected to the second transistor M6. Such "cross-coupled" bias circuit, the variable potential levels of bias voltages Vbias1, Vbias2 can be determined depending on the potential variation in the both differential input signals +Vin, −Vin. With such an arrangement, it is possible to further improve the frequency characteristic of the CMOS operational amplifier circuit.

The present invention is not limited to the above-described specific embodiments and may be practiced or embodied in still other ways without departing from the spirit or essential character thereof.

What is claimed is:

1. An analog integrated circuit comprising:
    a differential amplifier having an inverting input, a non-inverting input, and first and second outputs, said differential amplifier being adapted to be coupled to a power supply voltage;
    an active load circuit coupled to the first and second outputs of said differential amplifier and to a ground potential;
    a transistor having a first current-carrying electrode coupled to the first output of said differential amplifier, a second current-carrying electrode coupled to said active load circuit, and a control electrode coupled to said active load circuit and the second output of said differential amplifier;
    an inversion amplifier having an input coupled to said second current-carrying electrode of said transistor, and an output; and
    a capacitive element coupled between the output of said inversion amplifier and said first output of said differential amplifier.

2. The integrated circuit according to claim 1, further comprising:
    a further transistor being same in conductivity type as said transistor and having a first current-carrying electrode coupled to the second output of said differential amplifier, a second current-carrying electrode coupled to said active load circuit, and a control electrode coupled to said control electrode of said transistor, said control electrode of said further transistor being coupled to said control electrode thereof.

3. The integrated circuit according to claim 1, further comprising:
    a further transistor being different in conductivity type from said transistor and having a first current-carrying electrode coupled to the second output of said differential amplifier, a second output of said differential amplifier, a second current-carrying electrode coupled to said active load circuit and said control electrode coupled to said first current-carrying electrode of itself.

4. An operational amplifier comprising:
    a pair of first and second transistors forming a differential amplifier having first and second inputs and an output;
    a pair of third and fourth transistors constituting an active load circuit associated with said differential amplifier, said differential amplifier and said active load circuit being arranged between a power supply voltage and a ground potential;
    a feedback circuit including an inversion amplifier and a capacitor, said capacitor being coupled between an output of said inversion amplifier and said output of said differential amplifier;
    a fifth transistor arranged at said output of said differential amplifier; and
    bias means for generating a bias voltage that may vary in potential in accordance with a potential variation in at least one of said first and second inputs of said differential amplifier, and for supplying the bias voltage to said fifth transistor.

5. The amplifier according to claim 4, wherein said bias means comprises:
    means for coupling said fifth transistor and said third and fourth transistors together at control electrodes thereof, and for coupling the control electrode of said fifth transistor to one of said first and second transistors at a current-carrying electrode thereof being connected to the ground potential through a corresponding one of said third and fourth transistors.

6. The amplifier according to claim 4, wherein said bias means comprises:

level-shift means coupled to at least one of said first and second inputs and said control electrode of said fifth transistor, for generating a variable voltage that is potentially level-shifted from said at least one of said first and second inputs, and for supplying the variable voltage to said control electrode of said fifth transistor.

7. The amplifier according to claim 6, wherein said level-shift means includes:

a sixth transistor having first and second current-carrying electrodes coupled to the power supply voltage and said control electrode of said fifth transistor, and a control electrode coupled to one of said first and second inputs.

8. The amplifier according to claim 6, wherein said level-shift means includes:

parallel-connected sixth and seventh transistors arranged between the power supply voltage and said control electrode of said fifth transistor, said sixth and seventh transistors having control electrodes coupled to said first and second inputs, respectively.

9. An analog integrated circuit comprising:

a differential amplifier having an inverting input, a non-inverting input, and first and second outputs, said differential amplifier being adapted to be coupled to a power supply voltage;

an active load circuit coupled to the first and second outputs of said differential amplifier and to a ground potential;

a transistor having a first current-carrying electrode coupled to the first output of said differential amplifier, a second current-carrying electrode coupled to said active load circuit, and a control electrode;

an inversion amplifier having an input coupled to said second current-carrying electrode of said transistor, and an output;

a capacitive element coupled between the output of said inversion amplifier and said first output of said differential amplifier; and a level-shift circuit coupled to the control electrode of said transistor and to at least one of the inverting and non-inverting inputs of said differential amplifier.

10. The integrated circuit according to claim 9, wherein said level-shift circuit includes:

a transistor having a first current-carrying electrode coupled to the power supply voltage, a second current-carrying electrode coupled to said control electrode of said transistor, and a control electrode coupled to one of said inverting and non-inverting inputs of said differential amplifier.

11. The integrated circuit according to claim 10, further comprising:

another transistor having a first current-carrying electrode coupled to the second output of said differential amplifier, a second current-carrying electrode coupled to said active load circuit, and a control electrode coupled to said control electrode of said transistor.

12. The integrated circuit according to claim 11, wherein the transistors and said another transistor comprise metal insulation semiconductor field effect transistors.

13. The integrated circuit according to claim 9, wherein said level-shift circuit includes:

a pair of transistors each having a first current-carrying electrode coupled to the power supply voltage, a second current-carrying electrode coupled to said control electrode of said transistor, and a control electrode coupled to a corresponding one of said inverting and non-inverting inputs of said differential amplifier.

14. The integrated circuit according to claim 13, further comprising:

another transistor having a first current-carrying electrode coupled to the second output of said differential amplifier, a second current-carrying electrode coupled to said active load circuit, and a control electrode coupled to the second current-carrying electrode of each of said pair of transistors.

15. The integrated circuit according to claim 14, wherein said transistor, said pair of transistor and said another transistor comprise metal insulation semi-conductor field effect transistors.

16. An amplifier circuit comprising:

first and second charge-transfer actuable devices defining an amplifier, each of said first and second actuable devices having first and second current-carrying electrodes and a control electrode, the first current-carrying electrodes of said first and second actuable devices being adapted to be coupled to a current source, the control electrodes of said first and second actuable devices being coupled to first and second inputs respectively;

active load means coupled to said first actuable device at the second current-carrying electrode thereof;

feedback means for causing a current being proportional to a time-derivative of an output of said amplifier circuit to be partially fed back thereto at a feedback node;

impedance reduction means for causing a voltage at the feedback node to be suppressed or prevented from varying in potential; and biasing means for providing said impedance reduction means with a bias voltage that may vary potentially in response to a variation in at least one of input signals being supplied to said first and second inputs.

17. The circuit according to claim 16, wherein said impedance reduction means comprises:

a third charge-transfer actuable device having a first current-carrying electrode coupled to one of the second current-carrying electrodes of said first and second actuable devices, a second current-carrying electrode coupled to said active load means, and a control electrode coupled to a selected one of internal circuit nodes of said amplifier circuit, which is responsive to a variation in at least one of input signals being supplied to said first and second inputs.

18. The circuit according to claim 17, wherein said feedback means comprises:

an inversion amplifier having an input coupled to one of the first and second current-carrying electrodes of said third actuable device, and an output coupled to the output of said amplifier circuit; and a capacitive element coupled to the output of said amplifier circuit and to the other of said first and second current-carrying electrodes of said third actuable device.

19. The circuit according to claim 18, further comprising:

filter means arranged between said control electrode of said third actuable device and said active load means.

20. The circuit according to claim 19, wherein said filter means includes a low-pass filter circuit.

21. The circuit according to claim 18, wherein said impedance reduction means further comprises:

a fourth charge-transfer actuable device having a first current-carrying electrode coupled to the other of said second current-carrying electrodes of said first and second actuable devices, a second current-carrying electrode coupled to said active load means, and a control electrode coupled to said selected one of internal circuit nodes of said amplifier circuit.

22. The circuit according to claim 21, further comprising:

a fifth charge-transfer actuable device coupled between said first potential and said control electrode of one of said third and fourth actuable devices, and having a control electrode potentially responsive to one of said first and second inputs; and a sixth charge-transfer actuable device coupled between said first potential and said control electrode of the other of said third and fourth actuable devices, and having a control electrode potentially responsive to the other of said first and second inputs.

23. The circuit according to claim 22, wherein said third and fourth actuable devices are coupled together at the control electrodes thereof.

24. The circuit according to claim 22, wherein said third and fourth actuable devices are electrically separated from each other at the control electrodes thereof.

25. The circuit according to claim 21, further comprising:

a fifth charge-transfer actuable device coupled between said first potential and said control electrode of one of said third and fourth actuable devices, and having a control electrode potentially responsive to the other of said first and second inputs.

26. The circuit according to claim 25, further comprising:

means for coupling the control electrodes of said third and fourth actuable devices together.

27. The circuit according to claim 25, wherein said third and fourth actuable devices are coupled to said first and second inputs, respectively.

28. The circuit according to claim 27, wherein those of the first to fourth actuable devices which are connected in series with each other have an insulated gate electrode that corresponds to the control electrodes thereof.

29. The circuit according to claim 28, wherein said gate electrode has a square-bracket or a comb-shaped pattern.

* * * * *

UNITED STATES PATENT AND TRADEMARK OFFICE
CERTIFICATE OF CORRECTION

PATENT NO. : 5,444,413
DATED : August 22, 1995
INVENTOR(S) : Tomohisa KIMURA, et al.

It is certified that error appears in the above-indentified patent and that said Letters Patent is hereby corrected as shown below:

On the title page, Item [75], the first inventor's city of residence should read:

--Funabashi--

Signed and Sealed this

Sixteenth Day of January, 1996

Attest:

BRUCE LEHMAN

*Attesting Officer*     *Commissioner of Patents and Trademarks*